United States Patent
Prest et al.

(10) Patent No.: US 9,279,733 B2
(45) Date of Patent: Mar. 8, 2016

(54) BULK AMORPHOUS ALLOY PRESSURE SENSOR

(75) Inventors: Christopher D. Prest, San Francisco, CA (US); Matthew S. Scott, Campbell, CA (US); Stephen P. Zadesky, Portola Valley, CA (US); Dermot J. Stratton, San Francisco, CA (US); Joseph C. Poole, San Francisco, CA (US); Theodore A. Waniuk, Lake Forest, CA (US)

(73) Assignee: Apple Inc., Cupertino, CA (US)

( * ) Notice: Subject to any disclaimer, the term of this patent is extended or adjusted under 35 U.S.C. 154(b) by 707 days.

(21) Appl. No.: 13/541,576

(22) Filed: Jul. 3, 2012

(65) Prior Publication Data

US 2014/0008999 A1      Jan. 9, 2014

(51) Int. Cl.
*H02B 1/24* (2006.01)
*G01L 1/22* (2006.01)
*H03K 17/965* (2006.01)

(52) U.S. Cl.
CPC ............... *G01L 1/22* (2013.01); *H03K 17/965* (2013.01); *H01H 2211/032* (2013.01); *H03K 2217/9651* (2013.01); *H03K 2217/96062* (2013.01); *Y10T 307/786* (2015.04)

(58) Field of Classification Search
None
See application file for complete search history.

(56) References Cited

U.S. PATENT DOCUMENTS

| | | | | |
|---|---|---|---|---|
| 4,371,883 A * | 2/1983 | Potember et al. | ................. | 257/1 |
| 4,507,672 A * | 3/1985 | Potember et al. | ................. | 438/99 |
| 4,652,894 A * | 3/1987 | Potember et al. | ................. | 257/1 |
| 4,821,011 A * | 4/1989 | Kotaki et al. | ................. | 338/4 |
| 4,938,069 A * | 7/1990 | Shoji et al. | ................. | 73/728 |
| 5,288,344 A | 2/1994 | Peker | | |
| 5,368,659 A | 11/1994 | Peker | | |
| 5,618,359 A | 4/1997 | Lin | | |
| 5,735,975 A | 4/1998 | Lin | | |
| 6,325,868 B1 | 12/2001 | Kim | | |
| 7,575,040 B2 | 8/2009 | Johnson | | |
| 7,902,474 B2 | 3/2011 | Mittleman | | |
| 2006/0072187 A1* | 4/2006 | McKinnell | ........... | B81B 3/0072 359/321 |
| 2007/0079907 A1 | 4/2007 | Johnson | | |
| 2008/0118387 A1 | 5/2008 | Demetriou | | |
| 2010/0084052 A1 | 4/2010 | Farmer | | |
| 2010/0300148 A1 | 12/2010 | Demetriou | | |

(Continued)

FOREIGN PATENT DOCUMENTS

BR  EP 2141364 A2 *  1/2010  ............... F15B 1/26
JP  2001-303218  10/2001

OTHER PUBLICATIONS

Inoue et al., "Bulk amorphous alloys with high mechanical strength and good soft magnetic properties in Fe—Tm—B (TM=IV-VIII group transition metal) system", Appl. Phys. Lett., vol. 71, p. 464 (1997).

(Continued)

*Primary Examiner* — Andre Allen
(74) *Attorney, Agent, or Firm* — Brownstein Hyatt Farber Schreck, LLP

(57) ABSTRACT

Pressure sensing systems comprising bulk-solidifying amorphous alloys and pressure-sensitive switches containing bulk-solidifying amorphous alloys. The bulk-solidifying amorphous alloys are capable of repeated deformation upon application of pressure, and change their electrical resistivity upon deformation, thereby enabling measurement of the change in resistivity and consequently, measuring the deformation and amount of pressure applied.

19 Claims, 11 Drawing Sheets

(56) References Cited

U.S. PATENT DOCUMENTS

2011/0186183 A1* 8/2011 Johnson ............... C22C 45/00
148/403
2014/0009215 A1* 1/2014 Prest et al. .................. 327/517
2015/0124401 A1* 5/2015 Prest ...................... C23C 4/122
361/679.55

OTHER PUBLICATIONS

Shen ET., "Bulk Glassy C043FE2OTA5.5B31.5 Alloy with High Glass-Forming Ability and Good Soft Magnetic Properties", Materials Transactions, vol. 42 No. 10 (2001) pp. 2136-2139.

* cited by examiner

BULK AMORPHOUS ALLOY PRESSURE SENSOR

FIELD OF THE INVENTION

The present invention relates to pressure sensors comprising bulk-solidifying amorphous alloys and pressure switches comprising bulk-solidifying amorphous alloy materials.

BACKGROUND

Pressure sensors find utility in many devices, including pressure transducers, altimeters, depth measurement devices, switches, diaphragms, and the like. Pressure sensors also may be used in consumer electronic devices that utilize touch sensor pads or displays. Switches that rely on pressing a button or contact pad are well-known and often used in consumer electronic products to implement buttons. For example, various consumer electronic devices, e.g., a mobile telephone, a personal digital assistant, game controller, or remote controller, typically include a plurality of buttons that a user can press to invoke various operations with respect to such devices. Such buttons can, for example, be used for function (e.g., send, end, navigate, etc.) buttons or for buttons of an alphanumeric keypad/keyboard. These buttons in many cases are implemented by dome switches.

A dome switch typically consists of a dome made from metal that can be deformed temporarily by a user press to invoke a switching action. Then, when the user press is removed, the dome returns to its original, undeformed shape. Today, with many electronic devices, proper operation of buttons is an important requirement for usability and user satisfaction. With respect to dome switches, the tactile feedback provided by dome switches is often very helpful to users of the consumer electronic products. However, conventional assembly of such buttons implemented by dome switches is inefficient and complicated. Generally, a dome must be placed on a substrate and corresponding structures often provide a button or key structure (with or without an actuation nub) that can be pressed downward to engage the dome during a button or key press. In some designs, activation nubs are provided on the button or key structure or on the peaks of the domes themselves. The formation of the activation nubs is a separate manufacturing step that is tedious and time-consuming. In addition, the placement of the actuation nubs relative to the domes is not always as accurate as desired. For example, if the actuation nub does not properly align with the center region of a dome, the tactile feedback for such dome switch will be disturbed and therefore not as robust as intended.

Many such switches typically employ thin crystalline metal materials that can be deformed sufficiently to enable the switch to make contact and create a circuit. The material typically is a suitable conductor of electricity, thus enabling current to flow upon contact. Materials may be characterized by their Young's modulus E, also called elasticity modulus (generally expressed in GPa), which characterizes its resistance to deformation. Many materials also are characterized by their elastic limit $\sigma_e$ (generally expressed in GPa), which represents the stress beyond which the material will plastically deform. Thus, it is possible, for a given thickness, to compare materials by establishing for each one the ratio of their elastic limit to their Young's modulus $\sigma_e/E$, wherein the ratio is representative of the elastic deformation of each material. The higher this ratio is, the greater the elastic deformation of the material.

Because switches on consumer electronic devices are operated frequently, the materials used to fabricate the switch must be capable of repeated deformation and return to their original configuration. The ability of a material to deform reversibly under stress is known as the material's elasticity. Above a certain stress, known as the elastic limit of a material or the yield strength, the metal material may deform irreversibly, becoming inelastic, exhibiting plasticity and adversely affecting the function and utility of the switch. Crystalline metallic materials such as those used in the prior art (e.g., titanium or stainless steel) typically have a low $\sigma_e/E$ ratio. These crystalline materials therefore have a limited elastic deformation, and may after repeated use, ultimately fail.

Moreover, because this elastic limit is low, when it deforms it approaches its region of plastic deformation under low stresses with the risk that it cannot resume its initial form. To avoid such a deformation, the deformation of the membrane is restricted, i.e. the amplitude of the movement of the membrane is intentionally limited. Due to the nature of conventional switching systems, more deformable, non-crystalline materials are not practical. That is, the material that deforms in a conventional switch, makes contact with electrical connections to create a circuit. Non-conductive amorphous materials such as plastics and rubbers, which typically have much greater elasticity than most crystalline metal materials, therefore cannot be employed in conventional switching systems that rely on the application of pressure to a material, subsequent deformation of that material and then contact to create an electric current.

Pressure sensors measure pressure of gas or liquids, and typically operate by generating an electrical signal as a function of the pressure. Such pressure sensors often are referred to as pressure transducers, or pressure transmitters, pressure indicators, piezometers, manometers, and the like. These pressure sensors operate by making use of strain gauges attached to a deformable object, such as a diaphragm. As the diaphragm deforms, the strain gauge attached thereto deforms, thereby causing the electrical resistance of the gauge to change. The change in electrical resistance then can be measured using a Wheatstone bridge.

SUMMARY

A proposed solution according to embodiments herein for pressure sensors is to use bulk-solidifying amorphous alloys as the deformable material, and to measure the pressure based on the physical changes of the bulk-solidifying amorphous alloy as it is deformed. In accordance with these and other embodiments, there is provided a pressure sensor comprising a bulk-solidifying amorphous alloy, a pressure measurement system electrically connected to the bulk-solidifying amorphous alloy that measures the change in resistivity of the bulk-solidifying amorphous alloy depending on the degree of deformation of the bulk-solidifying amorphous alloy, and provides an output equal to the pressure applied to deform the bulk-solidifying amorphous alloy.

In accordance with another embodiment, there is provided a switch comprising an actuator capable of being depressed, a bulk-solidifying amorphous alloy positioned adjacent the actuator, whereby pressing the actuator deforms the bulk-solidifying amorphous alloy. The switch further comprises a pressure measurement and control system electrically connected to the bulk-solidifying amorphous alloy that measures the change in resistivity of the bulk-solidifying amorphous alloy, and presents a switching function when the pressure reaches a predetermined value.

In accordance with an additional embodiment, there is provided an electronic device that includes at least one switch comprising an actuator capable of being depressed, a bulk-solidifying amorphous alloy positioned adjacent the actuator, whereby pressing the actuator deforms the bulk-solidifying amorphous alloy. The switch further comprises a pressure measurement and control system electrically connected to the bulk-solidifying amorphous alloy that measures the change in resistivity of the bulk-solidifying amorphous alloy, and presents a switching function when the pressure reaches a predetermined value.

DETAILED DESCRIPTION

All publications, patents, and patent applications cited in this Specification are hereby incorporated by reference in their entirety.

The articles "a" and "an" are used herein to refer to one or to more than one (i.e., to at least one) of the grammatical object of the article. By way of example, "a polymer resin" means one polymer resin or more than one polymer resin. Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Bulk-solidifying amorphous alloys, or bulk metallic glasses ("BMG"), are a recently developed class of metallic materials. These alloys may be solidified and cooled at relatively slow rates, and they retain the amorphous, non-crystalline (i.e., glassy) state at room temperature. Amorphous alloys have many superior properties than their crystalline counterparts. However, if the cooling rate is not sufficiently high, crystals may form inside the alloy during cooling, so that the benefits of the amorphous state can be lost. For example, one challenge with the fabrication of bulk amorphous alloy parts is partial crystallization of the parts due to either slow cooling or impurities in the raw alloy material. As a high degree of amorphicity (and, conversely, a low degree of crystallinity) is desirable in BMG parts, there is a need to develop methods for casting BMG parts having controlled amount of amorphicity.

Figure 1:
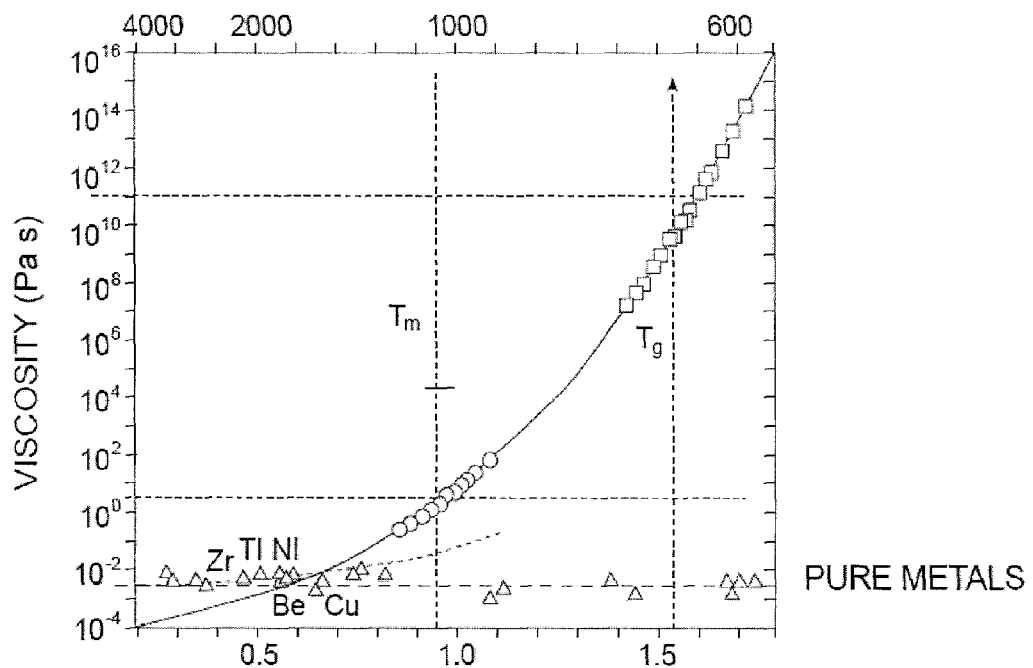
FIG. 1 provides a temperature-viscosity diagram of an exemplary bulk solidifying amorphous alloy.

FIG. 1 (obtained from U.S. Pat. No. 7,575,040) shows a viscosity-temperature graph of an exemplary bulk solidifying amorphous alloy, from the VIT-001 series of Zr—Ti—Ni—Cu—Be family manufactured by Liquidmetal Technology. It should be noted that there is no clear liquid/solid transformation for a bulk solidifying amorphous metal during the formation of an amorphous solid. The molten alloy becomes more and more viscous with increasing undercooling until it approaches solid form around the glass transition temperature. Accordingly, the temperature of solidification front for bulk solidifying amorphous alloys can be around glass transition temperature, where the alloy will practically act as a solid for the purposes of pulling out the quenched amorphous sheet product.

Figure 2:
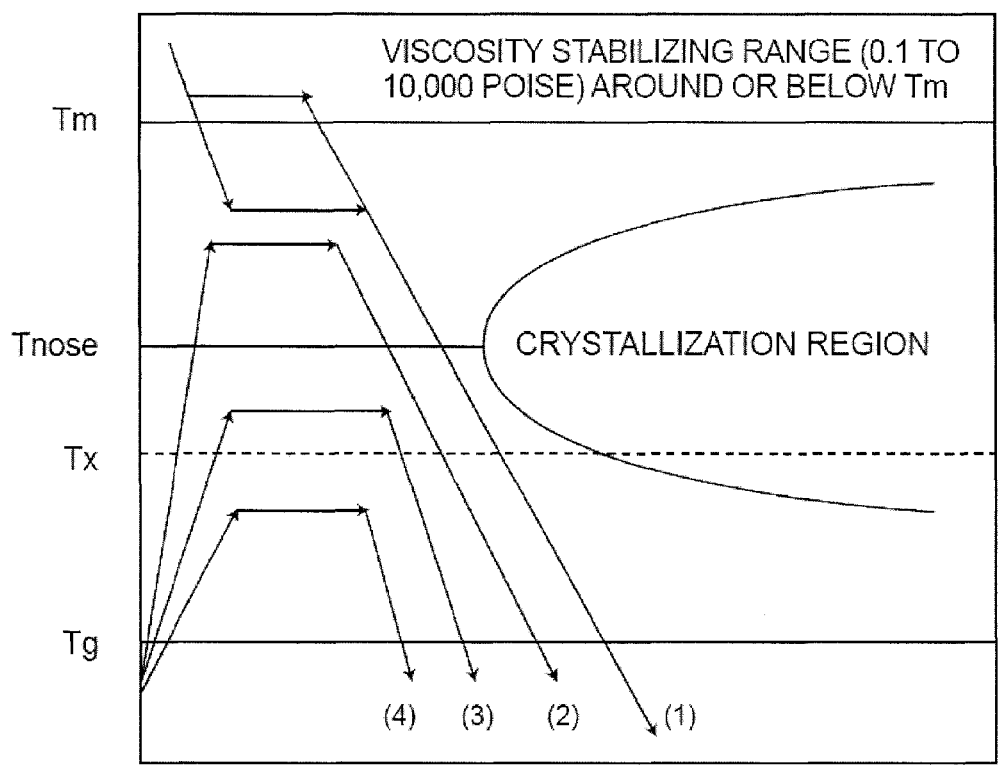
FIG. 2 provides a schematic of a time-temperature-transformation (TTT) diagram for an exemplary bulk solidifying amorphous alloy.

FIG. 2 (obtained from U.S. Pat. No. 7,575,040) shows the time-temperature-transformation (TTT) cooling curve of an exemplary bulk solidifying amorphous alloy, or TTT diagram. Bulk-solidifying amorphous metals do not experience a liquid/solid crystallization transformation upon cooling, as with conventional metals. Instead, the highly fluid, non crystalline form of the metal found at high temperatures (near a "melting temperature" Tm) becomes more viscous as the temperature is reduced (near to the glass transition temperature Tg), eventually taking on the outward physical properties of a conventional solid.

Even though there is no liquid/crystallization transformation for a bulk solidifying amorphous metal, a "melting temperature" Tm may be defined as the thermodynamic liquidus temperature of the corresponding crystalline phase. Under this regime, the viscosity of bulk-solidifying amorphous alloys at the melting temperature could lie in the range of about 0.1 poise to about 10,000 poise, and even sometimes under 0.01 poise. A lower viscosity at the "melting temperature" would provide faster and complete filling of intricate portions of the shell/mold with a bulk solidifying amorphous metal for forming the BMG parts. Furthermore, the cooling rate of the molten metal to form a BMG part has to such that the time-temperature profile during cooling does not traverse through the nose-shaped region bounding the crystallized region in the TTT diagram of FIG. 2. In FIG. 2, Tnose is the critical crystallization temperature Tx where crystallization is most rapid and occurs in the shortest time scale.

The supercooled liquid region, the temperature region between Tg and Tx is a manifestation of the extraordinary stability against crystallization of bulk solidification alloys. In this temperature region the bulk solidifying alloy can exist as a high viscous liquid. The viscosity of the bulk solidifying alloy in the supercooled liquid region can vary between $10^{12}$ Pa s at the glass transition temperature down to $10^5$ Pa s at the crystallization temperature, the high temperature limit of the supercooled liquid region. Liquids with such viscosities can undergo substantial plastic strain under an applied pressure. The embodiments herein make use of the large plastic formability in the supercooled liquid region as a forming and separating method.

One needs to clarify something about Tx. Technically, the nose-shaped curve shown in the TTT diagram describes Tx as a function of temperature and time. Thus, regardless of the trajectory that one takes while heating or cooling a metal alloy, when one hits the TTT curve, one has reached Tx. In FIG. 2, Tx is shown as a dashed line as Tx can vary from close to Tm to close to Tg.

The schematic TTT diagram of FIG. 2 shows processing methods of die casting from at or above Tm to below Tg without the time-temperature trajectory (shown as (1) as an example trajectory) hitting the TTT curve. During die casting, the forming takes place substantially simultaneously with fast cooling to avoid the trajectory hitting the TTT curve. The processing methods for superplastic forming (SPF) from at or below Tg to below Tm without the time-temperature trajectory (shown as (2), (3) and (4) as example trajectories) hitting the TTT curve. In SPF, the amorphous BMG is reheated into the supercooled liquid region where the available processing window could be much larger than die casting, resulting in better controllability of the process. The SPF process does not require fast cooling to avoid crystallization during cooling. Also, as shown by example trajectories (2), (3) and (4), the SPF can be carried out with the highest temperature during SPF being above Tnose or below Tnose, up to about Tm. If one heats up a piece of amorphous alloy but manages to avoid hitting the TTT curve, you have heated "between Tg and Tm", but one would have not reached Tx.

Typical differential scanning calorimeter (DSC) heating curves of bulk-solidifying amorphous alloys taken at a heating rate of 20 C/min describe, for the most part, a particular trajectory across the TTT data where one would likely see a Tg at a certain temperature, a Tx when the DSC heating ramp crosses the TTT crystallization onset, and eventually melting peaks when the same trajectory crosses the temperature range for melting. If one heats a bulk-solidifying amorphous alloy at a rapid heating rate as shown by the ramp up portion of trajectories (2), (3) and (4) in FIG. 2, then one could avoid the TTT curve entirely, and the DSC data would show a glass transition but no Tx upon heating. Another way to think about it is trajectories (2), (3) and (4) can fall anywhere in temperature between the nose of the TTT curve (and even above it) and the Tg line, as long as it does not hit the crystallization curve. That just means that the horizontal plateau in trajectories might get much shorter as one increases the processing temperature.

Phase

The term "phase" herein can refer to one that can be found in a thermodynamic phase diagram. A phase is a region of space (e.g., a thermodynamic system) throughout which all physical properties of a material are essentially uniform. Examples of physical properties include density, index of refraction, chemical composition and lattice periodicity. A simple description of a phase is a region of material that is chemically uniform, physically distinct, and/or mechanically separable. For example, in a system consisting of ice and water in a glass jar, the ice cubes are one phase, the water is a second phase, and the humid air over the water is a third phase. The glass of the jar is another separate phase. A phase can refer to a solid solution, which can be a binary, tertiary, quaternary, or more, solution, or a compound, such as an intermetallic compound. As another example, an amorphous phase is distinct from a crystalline phase.

Metal, Transition Metal, and Non-Metal

The term "metal" refers to an electropositive chemical element. The term "element" in this Specification refers generally to an element that can be found in a Periodic Table. Physically, a metal atom in the ground state contains a partially filled band with an empty state close to an occupied state. The term "transition metal" is any of the metallic elements within Groups 3 to 12 in the Periodic Table that have an incomplete inner electron shell and that serve as transitional links between the most and the least electropositive in a series of elements. Transition metals are characterized by multiple valences, colored compounds, and the ability to form stable complex ions. The term "nonmetal" refers to a chemical element that does not have the capacity to lose electrons and form a positive ion.

Depending on the application, any suitable nonmetal elements, or their combinations, can be used. The alloy (or "alloy composition") can comprise multiple nonmetal elements, such as at least two, at least three, at least four, or more, nonmetal elements. A nonmetal element can be any element that is found in Groups 13-17 in the Periodic Table. For example, a nonmetal element can be any one of F, Cl, Br, I, At, O, S, Se, Te, Po, N, P, As, Sb, Bi, C, Si, Ge, Sn, Pb, and B. Occasionally, a nonmetal element can also refer to certain metalloids (e.g., B, Si, Ge, As, Sb, Te, and Po) in Groups 13-17. In one embodiment, the nonmetal elements can include B, Si, C, P, or combinations thereof. Accordingly, for example, the alloy can comprise a boride, a carbide, or both.

A transition metal element can be any of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, meitnerium, ununnilium, unununium, and ununbium. In one embodiment, a BMG containing a transition metal element can have at least one of Sc, Y, La, Ac, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, and Hg. Depending on the application, any suitable transitional metal elements, or their combinations, can be used. The alloy composition can comprise multiple transitional metal elements, such as at least two, at least three, at least four, or more, transitional metal elements.

The presently described alloy or alloy "sample" or "specimen" alloy can have any shape or size. For example, the alloy can have a shape of a particulate, which can have a shape such as spherical, ellipsoid, wire-like, rod-like, sheet-like, flake-like, or an irregular shape. The particulate can have any size. For example, it can have an average diameter of between about 1 micron and about 100 microns, such as between about 5 microns and about 80 microns, such as between about 10 microns and about 60 microns, such as between about 15 microns and about 50 microns, such as between about 15 microns and about 45 microns, such as between about 20 microns and about 40 microns, such as between about 25 microns and about 35 microns. For example, in one embodiment, the average diameter of the particulate is between about 25 microns and about 44 microns. In some embodiments, smaller particulates, such as those in the nanometer range, or larger particulates, such as those bigger than 100 microns, can be used.

The alloy sample or specimen can also be of a much larger dimension. For example, it can be a bulk structural component, such as an ingot, housing/casing of an electronic device or even a portion of a structural component that has dimensions in the millimeter, centimeter, or meter range.

Solid Solution

The term "solid solution" refers to a solid form of a solution. The term "solution" refers to a mixture of two or more substances, which may be solids, liquids, gases, or a combination of these. The mixture can be homogeneous or heterogeneous. The term "mixture" is a composition of two or more substances that are combined with each other and are generally capable of being separated. Generally, the two or more substances are not chemically combined with each other.

Alloy

In some embodiments, the alloy composition described herein can be fully alloyed. In one embodiment, an "alloy" refers to a homogeneous mixture or solid solution of two or more metals, the atoms of one replacing or occupying interstitial positions between the atoms of the other; for example, brass is an alloy of zinc and copper. An alloy, in contrast to a composite, can refer to a partial or complete solid solution of one or more elements in a metal matrix, such as one or more compounds in a metallic matrix. The term alloy herein can refer to both a complete solid solution alloy that can give single solid phase microstructure and a partial solution that can give two or more phases. An alloy composition described herein can refer to one comprising an alloy or one comprising an alloy-containing composite.

Thus, a fully alloyed alloy can have a homogenous distribution of the constituents, be it a solid solution phase, a compound phase, or both. The term "fully alloyed" used herein can account for minor variations within the error tolerance. For example, it can refer to at least 90% alloyed, such as at least 95% alloyed, such as at least 99% alloyed, such as at least 99.5% alloyed, such as at least 99.9% alloyed. The percentage herein can refer to either volume percent or weight percentage, depending on the context. These percentages can be balanced by impurities, which can be in terms of composition or phases that are not a part of the alloy.

Amorphous or Non-Crystalline Solid

An "amorphous" or "non-crystalline solid" is a solid that lacks lattice periodicity, which is characteristic of a crystal. As used herein, an "amorphous solid" includes "glass" which is an amorphous solid that softens and transforms into a liquid-like state upon heating through the glass transition. Generally, amorphous materials lack the long-range order characteristic of a crystal, though they can possess some short-range order at the atomic length scale due to the nature of chemical bonding. The distinction between amorphous solids and crystalline solids can be made based on lattice periodicity as determined by structural characterization techniques such as x-ray diffraction and transmission electron microscopy.

The terms "order" and "disorder" designate the presence or absence of some symmetry or correlation in a many-particle system. The terms "long-range order" and "short-range order" distinguish order in materials based on length scales.

The strictest form of order in a solid is lattice periodicity: a certain pattern (the arrangement of atoms in a unit cell) is repeated again and again to form a translationally invariant tiling of space. This is the defining property of a crystal. Possible symmetries have been classified in 14 Bravais lattices and 230 space groups.

Lattice periodicity implies long-range order. If only one unit cell is known, then by virtue of the translational symmetry it is possible to accurately predict all atomic positions at arbitrary distances. The converse is generally true, except, for example, in quasi-crystals that have perfectly deterministic tilings but do not possess lattice periodicity.

Long-range order characterizes physical systems in which remote portions of the same sample exhibit correlated behavior. This can be expressed as a correlation function, namely the spin-spin correlation function:

$$G(x,x') = \langle s(x), s(x') \rangle$$

In the above function, s is the spin quantum number and x is the distance function within the particular system. This function is equal to unity when $x = x'$ and decreases as the distance $|x-x'|$ increases. Typically, it decays exponentially to zero at large distances, and the system is considered to be disordered. If, however, the correlation function decays to a constant value at large $|x-x'|$, then the system can be said to possess long-range order. If it decays to zero as a power of the distance, then it can be called quasi-long-range order. Note that what constitutes a large value of $|x-x'|$ is relative.

A system can be said to present quenched disorder when some parameters defining its behavior are random variables that do not evolve with time (i.e., they are quenched or frozen)—e.g., spin glasses. It is opposite to annealed disorder, where the random variables are allowed to evolve themselves. Embodiments herein include systems comprising quenched disorder.

The alloy described herein can be crystalline, partially crystalline, amorphous, or substantially amorphous. For example, the alloy sample/specimen can include at least some crystallinity, with grains/crystals having sizes in the nanometer and/or micrometer ranges. Alternatively, the alloy can be substantially amorphous, such as fully amorphous. In one embodiment, the alloy composition is at least substantially not amorphous, such as being substantially crystalline, such as being entirely crystalline.

In one embodiment, the presence of a crystal or a plurality of crystals in an otherwise amorphous alloy can be construed as a "crystalline phase" therein. The degree of crystallinity (or "crystallinity" for short in some embodiments) of an alloy can refer to the amount of the crystalline phase present in the alloy. The degree can refer to, for example, a fraction of crystals present in the alloy. The fraction can refer to volume fraction or weight fraction, depending on the context. A measure of how "amorphous" an amorphous alloy is can be amorphicity. Amorphicity can be measured in terms of a degree of crystallinity. For example, in one embodiment, an alloy having a low degree of crystallinity can be said to have a high degree of amorphicity. In one embodiment, for example, an alloy having 60 vol % crystalline phase can have a 40 vol % amorphous phase.

Amorphous Alloy or Amorphous Metal

An "amorphous alloy" is an alloy having an amorphous content of more than 50% by volume, preferably more than 90% by volume of amorphous content, more preferably more than 95% by volume of amorphous content, and most preferably more than 99% to almost 100% by volume of amorphous content. Note that, as described above, an alloy high in amorphicity is equivalently low in degree of crystallinity. An "amorphous metal" is an amorphous metal material with a disordered atomic-scale structure. In contrast to most metals, which are crystalline and therefore have a highly ordered arrangement of atoms, amorphous alloys are non-crystalline. Materials in which such a disordered structure is produced directly from the liquid state during cooling are sometimes referred to as "glasses." Accordingly, amorphous metals are commonly referred to as "metallic glasses" or "glassy metals." In one embodiment, a bulk metallic glass ("BMG") can refer to an alloy, of which the microstructure is at least partially amorphous. However, there are several ways besides extremely rapid cooling to produce amorphous metals, including physical vapor deposition, solid-state reaction, ion irradiation, melt spinning, and mechanical alloying. Amorphous alloys can be a single class of materials, regardless of how they are prepared.

Amorphous metals can be produced through a variety of quick-cooling methods. For instance, amorphous metals can be produced by sputtering molten metal onto a spinning metal disk. The rapid cooling, on the order of millions of degrees a second, can be too fast for crystals to form, and the material is thus "locked in" a glassy state. Also, amorphous metals/alloys can be produced with critical cooling rates low enough to allow formation of amorphous structures in thick layers—e.g., bulk metallic glasses.

The terms "bulk metallic glass" ("BMG"), bulk amorphous alloy ("BAA"), and bulk solidifying amorphous alloy are used interchangeably herein. They refer to amorphous alloys having the smallest dimension at least in the millimeter range. For example, the dimension can be at least about 0.5 mm, such as at least about 1 mm, such as at least about 2 mm, such as at least about 4 mm, such as at least about 5 mm, such as at least about 6 mm, such as at least about 8 mm, such as at least about 10 mm, such as at least about 12 mm. Depending on the geometry, the dimension can refer to the diameter, radius, thickness, width, length, etc. A BMG can also be a metallic glass having at least one dimension in the centimeter range, such as at least about 1.0 cm, such as at least about 2.0 cm, such as at least about 5.0 cm, such as at least about 10.0 cm. In some embodiments, a BMG can have at least one dimension at least in the meter range. A BMG can take any of the shapes or forms described above, as related to a metallic glass. Accordingly, a BMG described herein in some embodiments can be different from a thin film made by a conventional deposition technique in one important aspect—the former can be of a much larger dimension than the latter.

Amorphous metals can be an alloy rather than a pure metal. The alloys may contain atoms of significantly different sizes, leading to low free volume (and therefore having viscosity up to orders of magnitude higher than other metals and alloys) in a molten state. The viscosity prevents the atoms from moving enough to form an ordered lattice. The material structure may result in low shrinkage during cooling and resistance to plastic deformation. The absence of grain boundaries, the weak spots of crystalline materials in some cases, may, for example, lead to better resistance to wear and corrosion. In one embodiment, amorphous metals, while technically glasses, may also be much tougher and less brittle than oxide glasses and ceramics.

Thermal conductivity of amorphous materials may be lower than that of their crystalline counterparts. To achieve formation of an amorphous structure even during slower cooling, the alloy may be made of three or more components, leading to complex crystal units with higher potential energy and lower probability of formation. The formation of amorphous alloy can depend on several factors: the composition of the components of the alloy; the atomic radius of the components (preferably with a significant difference of over 12% to achieve high packing density and low free volume); and the negative heat of mixing the combination of components, inhibiting crystal nucleation and prolonging the time the molten metal stays in a supercooled state. However, as the formation of an amorphous alloy is based on many different variables, it can be difficult to make a prior determination of whether an alloy composition would form an amorphous alloy.

Amorphous alloys, for example, of boron, silicon, phosphorus, and other glass formers with magnetic metals (iron, cobalt, nickel) may be magnetic, with low coercivity and high electrical resistance. The high resistance leads to low losses by eddy currents when subjected to alternating magnetic fields, a property useful, for example, as transformer magnetic cores.

Amorphous alloys may have a variety of potentially useful properties. In particular, they tend to be stronger than crystalline alloys of similar chemical composition, and they can sustain larger reversible ("elastic") deformations than crystalline alloys. Amorphous metals derive their strength directly from their non-crystalline structure, which can have none of the defects (such as dislocations) that limit the strength of crystalline alloys. For example, one modern amorphous metal, known as Vitreloy™, has a tensile strength that is almost twice that of high-grade titanium. In some embodiments, metallic glasses at room temperature are not ductile and tend to fail suddenly when loaded in tension, which limits the material applicability in reliability-critical applications, as the impending failure is not evident. Therefore, to overcome this challenge, metal matrix composite materials having a metallic glass matrix containing dendritic particles or fibers of a ductile crystalline metal can be used. Alternatively, a BMG low in element(s) that tend to cause embitterment (e.g., Ni) can be used. For example, a Ni-free BMG can be used to improve the ductility of the BMG.

Another useful property of bulk amorphous alloys is that they can be true glasses; in other words, they can soften and flow upon heating. This can allow for easy processing, such as by injection molding, in much the same way as polymers. As a result, amorphous alloys can be used for making sports equipment, medical devices, electronic components and equipment, and thin films. Thin films of amorphous metals can be deposited as protective coatings via a high velocity oxygen fuel technique.

A material can have an amorphous phase, a crystalline phase, or both. The amorphous and crystalline phases can have the same chemical composition and differ only in the microstructure—i.e., one amorphous and the other crystalline. Microstructure in one embodiment refers to the structure of a material as revealed by a microscope at 25× magnification or higher. Alternatively, the two phases can have different chemical compositions and microstructures. For example, a composition can be partially amorphous, substantially amorphous, or completely amorphous.

As described above, the degree of amorphicity (and conversely the degree of crystallinity) can be measured by fraction of crystals present in the alloy. The degree can refer to volume fraction of weight fraction of the crystalline phase present in the alloy. A partially amorphous composition can refer to a composition of at least about 5 vol % of which is of an amorphous phase, such as at least about 10 vol %, such as at least about 20 vol %, such as at least about 40 vol %, such as at least about 60 vol %, such as at least about 80 vol %, such as at least about 90 vol %. The terms "substantially" and "about" have been defined elsewhere in this application. Accordingly, a composition that is at least substantially amorphous can refer to one of which at least about 90 vol % is amorphous, such as at least about 95 vol %, such as at least about 98 vol %, such as at least about 99 vol %, such as at least about 99.5 vol %, such as at least about 99.8 vol %, such as at least about 99.9 vol %. In one embodiment, a substantially amorphous composition can have some incidental, insignificant amount of crystalline phase present therein.

In one embodiment, an amorphous alloy composition can be homogeneous with respect to the amorphous phase. A substance that is uniform in composition is homogeneous. This is in contrast to a substance that is heterogeneous. The term "composition" refers to the chemical composition and/or microstructure in the substance. A substance is homogeneous when a volume of the substance is divided in half and both halves have substantially the same composition. For example, a particulate suspension is homogeneous when a volume of the particulate suspension is divided in half and both halves have substantially the same volume of particles.

However, it might be possible to see the individual particles under a microscope. Another example of a homogeneous substance is air where different ingredients therein are equally suspended, though the particles, gases and liquids in air can be analyzed separately or separated from air.

A composition that is homogeneous with respect to an amorphous alloy can refer to one having an amorphous phase substantially uniformly distributed throughout its microstructure. In other words, the composition macroscopically comprises a substantially uniformly distributed amorphous alloy throughout the composition. In an alternative embodiment, the composition can be of a composite, having an amorphous phase having therein a non-amorphous phase. The non-amorphous phase can be a crystal or a plurality of crystals. The crystals can be in the form of particulates of any shape, such as spherical, ellipsoid, wire-like, rod-like, sheet-like, flake-like, or an irregular shape. In one embodiment, it can have a dendritic form. For example, an at least partially amorphous composite composition can have a crystalline phase in the shape of dendrites dispersed in an amorphous phase matrix; the dispersion can be uniform or non-uniform, and the amorphous phase and the crystalline phase can have the same or a different chemical composition. In one embodiment, they have substantially the same chemical composition. In another embodiment, the crystalline phase can be more ductile than the BMG phase.

The methods described herein can be applicable to any type of amorphous alloy. Similarly, the amorphous alloy described herein as a constituent of a composition or article can be of any type. The amorphous alloy can comprise the element Zr, Hf, Ti, Cu, Ni, Pt, Pd, Fe, Mg, Au, La, Ag, Al, Mo, Nb, Be, or combinations thereof. Namely, the alloy can include any combination of these elements in its chemical formula or chemical composition. The elements can be present at different weight or volume percentages. For example, an iron "based" alloy can refer to an alloy having a non-insignificant weight percentage of iron present therein, the weight percent can be, for example, at least about 20 wt %, such as at least about 40 wt %, such as at least about 50 wt %, such as at least about 60 wt %, such as at least about 80 wt %. Alternatively, in one embodiment, the above-described percentages can be volume percentages, instead of weight percentages. Accordingly, an amorphous alloy can be zirconium-based, titanium-based, platinum-based, palladium-based, gold-based, silver-based, copper-based, iron-based, nickel-based, aluminum-based, molybdenum-based, and the like. The alloy can also be free of any of the aforementioned elements to suit a particular purpose. For example, in some embodiments, the alloy, or the composition including the alloy, can be substantially free of nickel, aluminum, titanium, beryllium, or combinations thereof. In one embodiment, the alloy or the composite is completely free of nickel, aluminum, titanium, beryllium, or combinations thereof.

For example, the amorphous alloy can have the formula $(Zr, Ti)_a(Ni, Cu, Fe)_b(Be, Al, Si, B)_c$, wherein a, b, and c each represents a weight or atomic percentage. In one embodiment, a is in the range of from 30 to 75, b is in the range of from 5 to 60, and c is in the range of from 0 to 50 in atomic percentages. Alternatively, the amorphous alloy can have the formula $(Zr, Ti)_a(Ni, Cu)_b(Be)_c$, wherein a, b, and c each represents a weight or atomic percentage. In one embodiment, a is in the range of from 40 to 75, b is in the range of from 5 to 50, and c is in the range of from 5 to 50 in atomic percentages. The alloy can also have the formula $(Zr, Ti)_a(Ni, Cu)_b(Be)_c$, wherein a, b, and c each represents a weight or atomic percentage. In one embodiment, a is in the range of from 45 to 65, b is in the range of from 7.5 to 35, and c is in the range of from 10 to 37.5 in atomic percentages. Alternatively, the alloy can have the formula $(Zr)_a(Nb, Ti)_b(Ni, Cu)_c(Al)_d$, wherein a, b, c, and d each represents a weight or atomic percentage. In one embodiment, a is in the range of from 45 to 65, b is in the range of from 0 to 10, c is in the range of from 20 to 40 and d is in the range of from 7.5 to 15 in atomic percentages. One exemplary embodiment of the aforedescribed alloy system is a Zr—Ti—Ni—Cu—Be based amorphous alloy under the trade name Vitreloy™, such as Vitreloy-1 and Vitreloy-101, as fabricated by Liquidmetal Technologies, CA, USA. Some examples of amorphous alloys of the different systems are provided in Table 1 and Table 2.

TABLE 1

Exemplary amorphous alloy compositions

| Alloy | Atm % | Atm % | Atm % | Atm % | Atm % | Atm % | Atm % | Atm % |
|---|---|---|---|---|---|---|---|---|
| 1 | Fe | Mo | Ni | Cr | P | C | B | |
|  | 68.00% | 5.00% | 5.00% | 2.00% | 12.50% | 5.00% | 2.50% | |
| 2 | Fe | Mo | Ni | Cr | P | C | B | Si |
|  | 68.00% | 5.00% | 5.00% | 2.00% | 11.00% | 5.00% | 2.50% | 1.50% |
| 3 | Pd | Cu | Co | P | | | | |
|  | 44.48% | 32.35% | 4.05% | 19.11% | | | | |
| 4 | Pd | Ag | Si | P | | | | |
|  | 77.50% | 6.00% | 9.00% | 7.50% | | | | |
| 5 | Pd | Ag | Si | P | Ge | | | |
|  | 79.00% | 3.50% | 9.50% | 6.00% | 2.00% | | | |
| 5 | Pt | Cu | Ag | P | B | Si | | |
|  | 74.70% | 1.50% | 0.30% | 18.0% | 4.00% | 1.50% | | |

TABLE 2

Additional Exemplary amorphous alloy compositions (atomic %)

| Alloy | Atm % | Atm % | Atm % | Atm % | Atm % | Atm % |
|---|---|---|---|---|---|---|
| 1 | Zr | Ti | Cu | Ni | Be | |
|  | 41.20% | 13.80% | 12.50% | 10.00% | 22.50% | |
| 2 | Zr | Ti | Cu | Ni | Be | |
|  | 44.00% | 11.00% | 10.00% | 10.00% | 25.00% | |
| 3 | Zr | Ti | Cu | Ni | Nb | Be |
|  | 56.25% | 11.25% | 6.88% | 5.63% | 7.50% | 12.50% |
| 4 | Zr | Ti | Cu | Ni | Al | Be |
|  | 64.75% | 5.60% | 14.90% | 11.15% | 2.60% | 1.00% |
| 5 | Zr | Ti | Cu | Ni | Al | |
|  | 52.50% | 5.00% | 17.90% | 14.60% | 10.00% | |
| 6 | Zr | Nb | Cu | Ni | Al | |
|  | 57.00% | 5.00% | 15.40% | 12.60% | 10.00% | |
| 7 | Zr | Cu | Ni | Al | | |
|  | 50.75% | 36.23% | 4.03% | 9.00% | | |

TABLE 2-continued

Additional Exemplary amorphous alloy compositions (atomic %)

| Alloy | Atm % | Atm % | Atm % | Atm % | Atm % | Atm % |
|---|---|---|---|---|---|---|
| 8 | Zr | Ti | Cu | Ni | Be | 46.25.86% |
| 9 | Zr 21.67% | Ti 43.33% | Ni 7.50% | Be 27.50% | | |
| 10 | Zr 35.00% | Ti 30.00% | Cu 7.50% | Be 27.50% | | |
| 11 | Zr 35.00% | Ti 30.00% | Co 6.00% | Be 29.00% | | |
| 12 | Zr 35.00% | Ti 30.00% | Fe 2.00% | Be 33.00% | | |
| 13 | Au 49.00% | Ag 5.50% | Pd 2.30% | Cu 26.90% | Si 16.30% | |
| 14 | Au 50.90% | Ag 3.00% | Pd 2.30% | Cu 27.80% | Si 16.00% | |
| 15 | Pt 57.50% | Cu 14.70% | Ni 5.30% | P 22.50% | | |
| 16 | Zr 36.60% | Ti 31.40% | Nb 7.00% | Cu 5.90% | Be 19.10% | |
| 17 | Zr 38.30% | Ti 32.90% | Nb 7.30% | Cu 6.20% | Be 15.30% | |
| 18 | Zr 39.60% | Ti 33.90% | Nb 7.60% | Cu 6.40% | Be 12.50% | |
| 19 | Cu 47.00% | Ti 34.00% | Zr 11.00% | Ni 8.00% | | |
| 20 | Zr 55.00% | Co 25.00% | Al 20.00% | | | |

Other exemplary ferrous metal-based alloys include compositions such as those disclosed in U.S. Patent Application Publication Nos. 2007/0079907 and 2008/0118387. These compositions include the Fe(Mn, Co, Ni, Cu) (C, Si, B, P, Al) system, wherein the Fe content is from 60 to 75 atomic percentage, the total of (Mn, Co, Ni, Cu) is in the range of from 5 to 25 atomic percentage, and the total of (C, Si, B, P, Al) is in the range of from 8 to 20 atomic percentage, as well as the exemplary composition $Fe_{48}Cr_{15}Mo_{14}Y_2C_{15}B_6$. They also include the alloy systems described by Fe—Cr—Mo—(Y,Ln)—C—B, Co—Cr—Mo-Ln-C—B, Fe—Mn—Cr—Mo—(Y,Ln)—C—B, (Fe, Cr, Co)—(Mo,Mn)—(C, B)—Y, Fe—(Co,Ni)—(Zr,Nb,Ta)—(Mo,W)—B, Fe—(Al, Ga)—(P,C,B,Si,Ge), Fe—(Co, Cr,Mo,Ga,Sb)—P—B—C, (Fe, Co)—B—Si—Nb alloys, and Fe—(Cr—Mo)—(C,B)—Tm, where Ln denotes a lanthanide element and Tm denotes a transition metal element. Furthermore, the amorphous alloy can also be one of the exemplary compositions $Fe_{80}P_{12.5}C_5B_{2.5}$, $Fe_{80}P_{11}C_5B_{2.5}Si_{1.5}$, $Fe_{74.5}Mo_{5.5}P_{12.5}C_5B_{2.5}$, $Fe_{74.5}Mo_{5.5}P_{11}C_5B_{2.5}Si_{1.5}$, $Fe_{70}Mo_5Ni_5P_{12.5}C_5B_{2.5}$, $Fe_{70}Mo_5Ni_5P_{11}C_5B_{2.5}Si_{1.5}$, $Fe_{68}Mo_5Ni_5Cr_2P_{12.5}C_5B_{2.5}$, and $Fe_{68}Mo_5Ni_5Cr_2P_{11}C_5B_{2.5}Si_{1.5}$, described in U.S. Patent Application Publication No. 2010/0300148.

The amorphous alloys can also be ferrous alloys, such as (Fe, Ni, Co) based alloys. Examples of such compositions are disclosed in U.S. Pat. Nos. 6,325,868; 5,288,344; 5,368,659; 5,618,359; and 5,735,975, Inoue et al., Appl. Phys. Lett., Volume 71, p 464 (1997), Shen et al., Mater. Trans., JIM, Volume 42, p 2136 (2001), and Japanese Patent Application No. 200126277 (Pub. No. 2001303218 A). One exemplary composition is $Fe_{72}Al_5Ga_2P_{11}C_6B_4$. Another example is $Fe_{72}Al_7Zr_{10}Mo_5W_2B_{15}$. Another iron-based alloy system that can be used in the coating herein is disclosed in U.S. Patent Application Publication No. 2010/0084052, wherein the amorphous metal contains, for example, manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron.

The aforedescribed amorphous alloy systems can further include additional elements, such as additional transition metal elements, including Nb, Cr, V, and Co. The additional elements can be present at less than or equal to about 30 wt %, such as less than or equal to about 20 wt %, such as less than or equal to about 10 wt %, such as less than or equal to about 5 wt %. In one embodiment, the additional, optional element is at least one of cobalt, manganese, zirconium, tantalum, niobium, tungsten, yttrium, titanium, vanadium and hafnium to form carbides and further improve wear and corrosion resistance. Further optional elements may include phosphorous, germanium and arsenic, totaling up to about 2%, and preferably less than 1%, to reduce melting point. Otherwise incidental impurities should be less than about 2% and preferably 0.5%.

In some embodiments, a composition having an amorphous alloy can include a small amount of impurities. The impurity elements can be intentionally added to modify the properties of the composition, such as improving the mechanical properties (e.g., hardness, strength, fracture mechanism, etc.) and/or improving the corrosion resistance. Alternatively, the impurities can be present as inevitable, incidental impurities, such as those obtained as a byproduct of processing and manufacturing. The impurities can be less than or equal to about 10 wt %, such as about 5 wt %, such as about 2 wt %, such as about 1 wt %, such as about 0.5 wt %, such as about 0.1 wt %. In some embodiments, these percentages can be volume percentages instead of weight percentages. In one embodiment, the alloy sample/composition consists essentially of the amorphous alloy (with only a small incidental amount of impurities). In another embodiment, the composition includes the amorphous alloy (with no observable trace of impurities).

In one embodiment, the final parts exceeded the critical casting thickness of the bulk solidifying amorphous alloys.

In embodiments herein, the existence of a supercooled liquid region in which the bulk-solidifying amorphous alloy can exist as a high viscous liquid allows for superplastic forming Large plastic deformations can be obtained. The ability to undergo large plastic deformation in the supercooled liquid region is used for the forming and/or cutting process. As oppose to solids, the liquid bulk solidifying alloy deforms locally which drastically lowers the required energy for cutting and forming. The ease of cutting and forming depends on the temperature of the alloy, the mold, and the cutting tool. As higher is the temperature, the lower is the viscosity, and consequently easier is the cutting and forming.

Embodiments herein can utilize a thermoplastic-forming process with amorphous alloys carried out between Tg and Tx, for example. Herein, Tx and Tg are determined from standard DSC measurements at typical heating rates (e.g. 20° C./min) as the onset of crystallization temperature and the onset of glass transition temperature.

The amorphous alloy components can have the critical casting thickness and the final part can have thickness that is thicker than the critical casting thickness. Moreover, the time and temperature of the heating and shaping operation is selected such that the elastic strain limit of the amorphous alloy could be substantially preserved to be not less than 1.0%, and preferably not being less than 1.5%. In the context of the embodiments herein, temperatures around glass transition means the forming temperatures can be below glass transition, at or around glass transition, and above glass transition temperature, but preferably at temperatures below the crystallization temperature $T_x$. The cooling step is carried out at rates similar to the heating rates at the heating step, and preferably at rates greater than the heating rates at the heating step. The cooling step is also achieved preferably while the forming and shaping loads are still maintained.

Electronic Devices

The embodiments herein can be valuable in the fabrication of electronic devices using a BMG. An electronic device herein can refer to any electronic device known in the art. For example, it can be a telephone, such as a cell phone, and a land-line phone, or any communication device, such as a smart phone, including, for example an iPhone™, and an electronic email sending/receiving device. It can be a part of a display, such as a digital display, a TV monitor, an electronic-book reader, a portable web-browser (e.g., iPad™), and a computer monitor. It can also be an entertainment device, including a portable DVD player, conventional DVD player, Blue-Ray disk player, video game console, music player, such as a portable music player (e.g., iPod™), etc. It can also be a part of a device that provides control, such as controlling the streaming of images, videos, sounds (e.g., Apple TV™), or it can be a remote control for an electronic device. It can be a part of a computer or its accessories, such as the hard drive tower housing or casing, laptop housing, laptop keyboard, laptop track pad, desktop keyboard, mouse, and speaker. The article can also be applied to a device such as a watch or a clock.

Embodiments of Pressure Sensors

The preferred embodiments include a pressure sensor comprising a bulk-solidifying amorphous alloy, a pressure measurement and control system electrically connected to the bulk-solidifying amorphous alloy that measures the change in resistivity of the bulk-solidifying amorphous alloy, and presents a circuit option when the pressure reaches a predetermined value.

Another preferred embodiment described herein provides a switch comprising an actuator capable of being depressed, a bulk-solidifying amorphous alloy positioned adjacent the actuator, whereby pressing the actuator deforms the bulk-solidifying amorphous alloy. The switch further comprises a pressure measurement and control system electrically connected to the bulk-solidifying amorphous alloy that measures the change in resistivity of the bulk-solidifying amorphous alloy, and presents a switching function when the pressure reaches a predetermined value.

An additional embodiment described herein provides an electronic device that includes at least one switch comprising an actuator capable of being depressed, a bulk-solidifying amorphous alloy positioned adjacent the actuator, whereby pressing the actuator deforms the bulk-solidifying amorphous alloy. The switch further comprises a pressure measurement and control system electrically connected to the bulk-solidifying amorphous alloy that measures the change in resistivity of the bulk-solidifying amorphous alloy, and presents a switching function when the pressure reaches a predetermined value.

Some of the preferred embodiments are directed to a dome switch that can be utilized on an electronic device to turn the device on and off, and to provide one or more buttons on the device that can be pressed to perform a function. For example, some devices may include a plurality of switching elements positioned about the device that underlie graphic images on a display. These graphic images may be, for example, icons for a variety of programming elements, or keys on a keypad. The switches or buttons therefore can be activated upon pressing the display on or near the graphic image. Use of a bulk-solidifying amorphous alloy as a deformable material that can deform upon application of pressure provides a rapid and easy mechanism by which a user can select a feature on a device, and that provides a tactile feedback to the user.

A feature of the bulk-solidifying amorphous alloy is that its electric resistivity changes upon deformation. Accordingly, as pressure is applied to the amorphous alloy, it will deform and as a consequence, its electric resistance can be measured by connecting two ends of the bulk-solidifying amorphous alloy to a current source, and measuring the change in resistivity as the alloy is deformed. Any method of measuring resistivity can be use, including a Wheatstone Bridge, a Chevron Bridge, a four-wire ohm circuit, or a constant current or voltage circuit. An exemplary constant current circuit is illustrated in FIG. 3, which can form a part of control system 300 utilized in accordance with preferred embodiments.

Resistance can be measured by exciting the bridge with either a constant voltage or a constant current source. Because R=V/I, if either V or I is held constant, the other will vary with the resistance. Both methods can be used in accordance with the embodiments. While there is no theoretical advantage to using a constant current source (FIG. 3) as compared to a constant voltage, in some cases the bridge output will be more linear in a constant current system. Also, if a constant current source is used, it eliminates the need to sense the voltage at the bridge; therefore, only two wires need to be connected to the bulk-solidifying amorphous alloy. The constant current circuit is most effective when dynamic strain is being measured. This is because, if a dynamic force is causing a change in the resistance of the bulk-solidifying amorphous alloy 105, one would measure the time varying component of the output ($V_{OUT}$), whereas slowly changing effects such as changes in lead resistance due to temperature variations would be rejected. Using this configuration, temperature drifts become nearly negligible.

Figure 3:
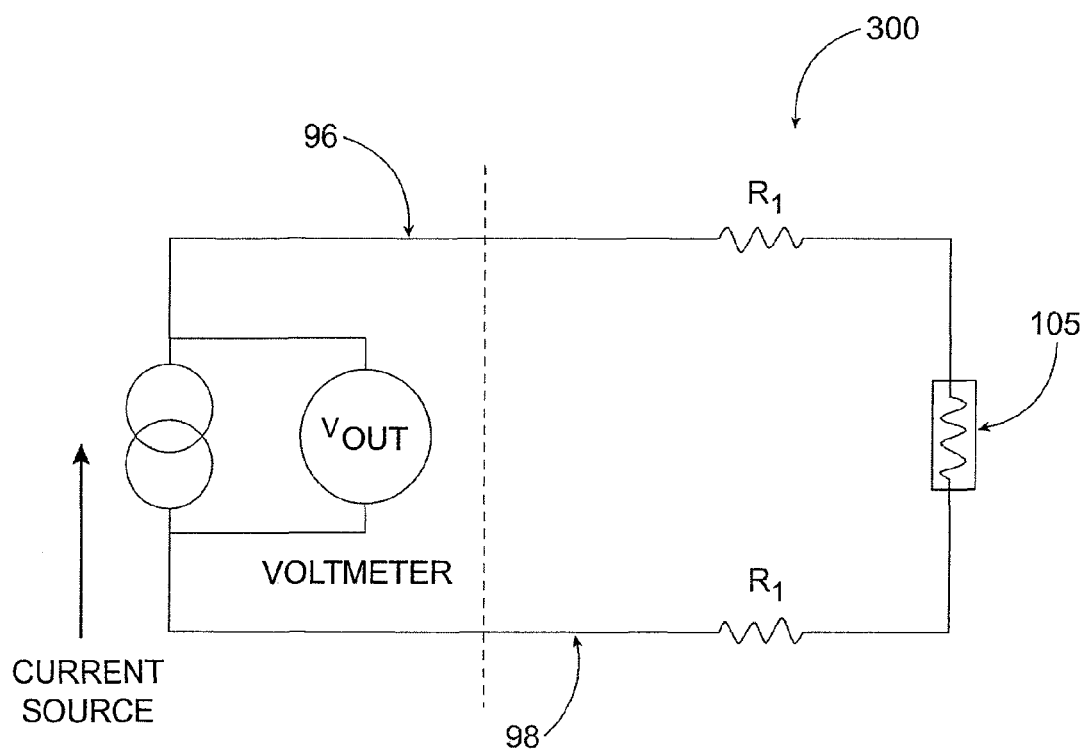
FIG. 3 is a circuit diagram for a constant voltage circuit for use in measuring the change in electrical resistance of a bulk-solidifying amorphous alloy in accordance with an embodiment.

The constant current control circuit of FIG. 3 forms a part of a simplified control system 300 that can be used to measure the change in resistance of bulk-solidifying amorphous alloy 105 as it is deformed by application of pressure. Connected to bulk-solidifying amorphous alloy 105 are traces 96 and 98 to complete the circuit. The output voltage $V_{OUT}$ can be connected to a control system (not shown) that determines the amount of pressure applied to bulk-solidifying amorphous alloy 105, depending on the value of $V_{OUT}$ an its relation to the constant current. The value of the ratio of $V/V_{OUT}$ can be correlated to the amount of pressure applied to bulk-solidifying amorphous alloy 105 depending on the composition of the alloy material, using techniques known in the art. For example, the control system 300 can be calibrated using a specific alloy composition and subjecting the alloy to known pressure intervals and measuring the change in resistivity using the constant current control circuit of FIG. 3. Those skilled in the art will be capable of determining the correlation between the change in resistivity of the bulk-solidifying amorphous alloy and the pressure applied, using the guidelines provided herein. The control system 300 then can provide a switching function when the change in resistivity reaches a certain value, indicative of a certain pressure applied, for example, the amount of pressure typically applied when pressing a button.

A preferred embodiment described herein relates to dome switches. The dome switches may be used in button assemblies in electronic devices. The following describes conventional electronic devices and dome switching technology upon which the present invention provides an improvement. The following description and accompanying drawings were excerpted from U.S. Pat. No. 7,902,474, the disclosure of which is incorporated by reference herein in its entirety.

Any electronic device may benefit from the embodiments described herein. Suitable electronic devices may be portable electronic devices such as laptop computers or small portable computers of the type that are sometimes referred to as ultraportables. Portable electronic devices also may be somewhat smaller devices. Examples of smaller portable electronic devices include wrist-watch devices, pendant devices, headphone and earpiece devices, and other wearable and miniature devices.

If desired, the electronic devices may be, for example, handheld wireless devices such as cellular telephones, media players with wireless communications capabilities, handheld computers (also sometimes called personal digital assistants), remote controllers, global positioning system (GPS) devices, and handheld gaming devices. The electronic devices may also be hybrid devices that combine the functionality of multiple conventional devices. Examples of hybrid portable electronic devices include a cellular telephone that includes media player functionality, a gaming device that includes a wireless communications capability, a cellular telephone that includes game and email functions, and a portable device that receives email, supports mobile telephone calls, has music player functionality and supports web browsing. These are merely illustrative examples.

Figure 4:
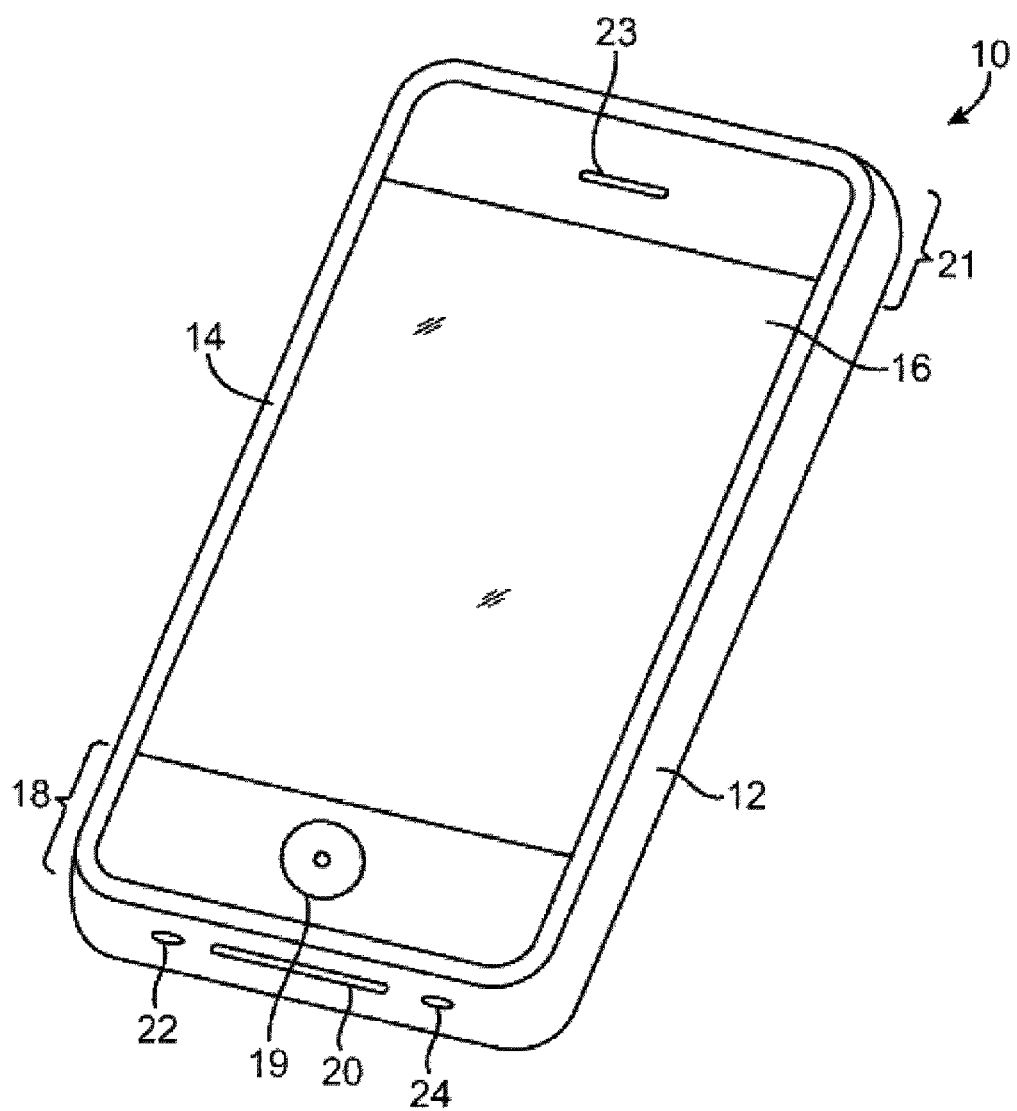
FIG. 4 is a perspective view of an illustrative portable electronic device in accordance with an embodiment of the present invention.

An illustrative portable electronic device in accordance with an embodiment is shown in FIG. 4. Device 10 of FIG. 4 may be, for example, a handheld electronic device that supports 2G, 3G and/or 4G cellular telephone and data functions, global positioning system capabilities, and local wireless communications capabilities (e.g., IEEE 802.11 and Bluetooth®) and that supports handheld computing device functions such as internet browsing, email and calendar functions, games, music player functionality, etc. Device 10 may have housing 12. Antennas for handling wireless communications may be housed within housing 12 (as an example).

Housing 12, which is sometimes referred to as a case, may be formed of any suitable materials including, plastic, glass, ceramics, metal, alloy, or other suitable materials, or a combination of these materials. In some situations, housing 12 or portions of housing 12 may be formed from a dielectric or other low-conductivity material. Housing 12 or portions of housing 12 may also be formed from conductive materials such as metal. An advantage of forming housing 12 from a dielectric material such as plastic is that this may help to reduce the overall weight of device 10 and may avoid potential interference with wireless operations.

Housing 12 may have a bezel, such as bezel 14. Bezel 14 may be formed from a conductive material and may serve to hold a display or other device with a planar surface in place on device 10 and/or to form an esthetically pleasing trim around the edge of device 10. Display 16 may be a liquid crystal display (LCD), an organic light emitting diode (OLED) display, or any other suitable display. The outermost surface of display 16 may be formed from one or more plastic or glass layers. If desired, touch screen functionality may be integrated into display 16 or may be provided using a separate touch pad device. An advantage of integrating a touch screen into display 16 to make display 16 touch sensitive is that this type of arrangement can save space and reduce visual clutter.

Display screen 16 (e.g., a touch screen) is merely one example of an input-output device that may be used with electronic device 10. If desired, electronic device 10 may have other input-output devices. For example, electronic device 10 may have user input control devices such as button 19, and input-output components such as port 20 and one or more input-output jacks (e.g., for audio and/or video). Button 19 may be, for example, a menu button. Port 20 may contain a 30-pin data connector (as an example). Buttons, for some devices, are designed for receipt of a human finger. As such, it may be desirable for the buttons to have a design and size to receive a human finger or thumb. Openings 22 and 24 may, if desired, form speaker and microphone ports. Speaker port 22 may be used when operating device 10 in speakerphone mode. Opening 23 may also form a speaker port. For example, speaker port 23 may serve as a telephone receiver that is placed adjacent to a user's ear during operation. In the example of FIG. 4, display screen 16 is shown as being mounted on the front face of handheld electronic device 10, but display screen 16 may, if desired, be mounted on the rear face of handheld electronic device 10, on a side of device 10, on a flip-up portion of device 10 that is attached to a main body portion of device 10 by a hinge (for example), or using any other suitable mounting arrangement.

A user of electronic device 10 may supply input commands using user input interface devices such as button 19 and touch screen 16. Touch screen 16 may be replaced with a display screen with a plurality of buttons positioned underneath the screen, each button optionally being designed in a manner similar to button 19. Suitable user input interface devices for electronic device 10 include buttons (e.g., alphanumeric keys, power on-off, power-on, power-off, and other specialized buttons, etc.), a touch pad, pointing stick, or other cursor control device, a microphone for supplying voice commands, or any other suitable interface for controlling device 10. Although shown schematically as being formed on the top face of electronic device 10 in the example of FIG. 4, buttons such as button 19 and other user input interface devices may generally be formed on any suitable portion of electronic device 10. For example, a button such as button 19 or other user interface control may be formed on the side of electronic device 10. Buttons and other user interface controls can also be located on the top face, rear face, or other portion of device 10. If desired, device 10 can be controlled remotely (e.g., using an infrared remote control, a radio-frequency remote control such as a Bluetooth® remote control, etc.).

Electronic device 10 may have ports such as port 20. Port 20, which may sometimes be referred to as a dock connector, 30-pin data port connector, input-output port, or bus connector, may be used as an input-output port (e.g., when connecting device 10 to a mating dock connected to a computer or other electronic device). Port 20 may contain pins for receiving data and power signals. Device 10 may also have audio and video jacks that allow device 10 to interface with external components. Examples of locations in which antenna structures may be located in device 10 include region 18 and region 21. These are merely illustrative examples. Any suitable portion of device 10 may be used to house antenna structures for device 10 if desired.

Figure 5:
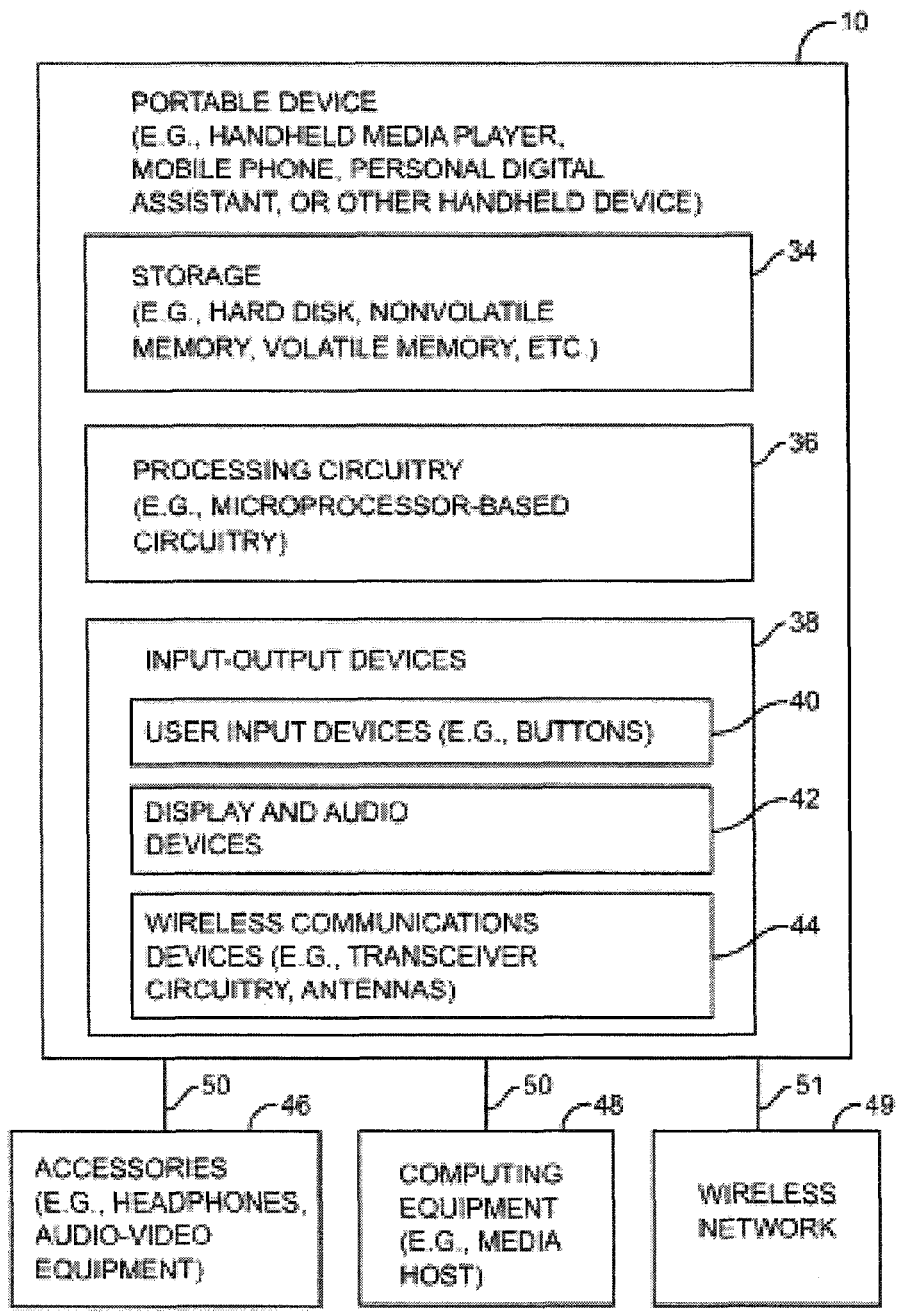
FIG. 5 is a schematic diagram of an illustrative portable electronic device in accordance with an embodiment of the present invention.

A schematic diagram of an embodiment of an illustrative portable electronic device such as a handheld electronic device is shown in FIG. 5. Portable device 10 may be a mobile telephone, a mobile telephone with media player capabilities, a handheld computer, a remote control, a game player, a global positioning system (GPS) device, a laptop computer, a tablet computer, an ultraportable computer, a hybrid device that includes the functionality of some or all of these devices, or any other suitable portable electronic device. As shown in FIG. 5, device 10 may include storage 34. Storage 34 may include one or more different types of storage such as hard disk drive storage, nonvolatile memory (e.g., flash memory or other electrically-programmable-read-only memory), volatile memory (e.g., battery-based static or dynamic random-access-memory), etc.

Processing circuitry 36 may be used to control the operation of device 10. Processing circuitry 36 may be based on a processor such as a microprocessor and other suitable integrated circuits. With one suitable arrangement, processing circuitry 36 and storage 34 are used to run software on device 10, such as internet browsing applications, voice-over-internet-protocol (VOIP) telephone call applications, email applications, media playback applications, operating system functions, etc. Processing circuitry 36 and storage 34 may be used in implementing suitable communications protocols. Communications protocols that may be implemented using processing circuitry 36 and storage 34 include internet protocols, wireless local area network protocols (e.g., IEEE 802.11 protocols—sometimes referred to as Wi-Fi®), protocols for other short-range wireless communications links such as the Bluetooth® protocol, protocols for handling 3G communications services (e.g., using wide band code division multiple access techniques), 2G cellular telephone communications protocols, etc. To minimize power consumption, processing circuitry 36 may include power management circuitry to implement power management functions. Processing circuitry 36 also may be used to control the functioning of the button(s) 19 present on device 10 in which the circuitry enables conversion of the deformation of button component(s) into an electrical output to initiate a switch function (e.g., on/off).

Input-output devices 38 may be used to allow data to be supplied to device 10 and to allow data to be provided from device 10 to external devices. Display screen 16, button 19, microphone port 24, speaker port 22, and dock connector port 20 are examples of input-output devices 38. Input-output devices 38 can include user input-output devices 40 such as buttons, touch screens, joysticks, click wheels, scrolling wheels, touch pads, key pads, keyboards, microphones, cameras, etc. A user can control the operation of device 10 by supplying commands through user input devices 40. Display and audio devices 42 may include liquid-crystal display (LCD) screens or other screens, light-emitting diodes (LEDs), and other components that present visual information and status data. Display and audio devices 42 may also include audio equipment such as speakers and other devices for creating sound. Display and audio devices 42 may contain audio-video interface equipment such as jacks and other connectors for external headphones and monitors.

Wireless communications devices 44 may include communications circuitry such as radio-frequency (RF) transceiver circuitry formed from one or more integrated circuits, power amplifier circuitry, passive RF components, antennas, and other circuitry for handling RF wireless signals. Wireless signals can also be sent using light (e.g., using infrared communications).

Device 10 can communicate with external devices such as accessories 46, computing equipment 48, and wireless network 49 as shown by paths 50 and 51. Paths 50 may include wired and wireless paths. Path 51 may be a wireless path. Accessories 46 may include headphones (e.g., a wireless cellular headset or audio headphones) and audio-video equipment (e.g., wireless speakers, a game controller, or other equipment that receives and plays audio and video content), a peripheral such as a wireless printer or camera, etc.

Computing equipment 48 may be any suitable computer. With one suitable arrangement, computing equipment 48 is a computer that has an associated wireless access point (router) or an internal or external wireless card that establishes a wireless connection with device 10. The computer may be a server (e.g., an internet server), a local area network computer with or without internet access, a user's own personal computer, a peer device (e.g., another portable electronic device 10), or any other suitable computing equipment. Wireless network 49 may include any suitable network equipment, such as cellular telephone base stations, cellular towers, wireless data networks, computers associated with wireless networks, etc. The antenna structures and wireless communications devices of device 10 may support communications over any suitable wireless communications bands.

To facilitate manufacturing operations, device 10 may be formed from two intermediate assemblies, representing upper and lower portions of device 10. The upper or top portion of device 10 may sometimes be referred to as a tilt assembly. The lower or bottom may portion of device 10 may sometimes be referred to as a housing assembly. The tilt and housing assemblies may each be formed from a number of smaller components. For example, the tilt assembly may be formed from components such as display 16 and an associated touch sensor. The housing assembly may include a plastic housing portion such as plastic housing portion 12 and printed circuit boards. Integrated circuits and other components may be mounted on the printed circuit boards. During manufacturing, one end of the tilt assembly may be inserted into the housing assembly. The tilt assembly may then be rotated ("tilted") into place so that the upper surface of the tilt assembly lies flush with the upper edges of the housing assembly.

Figure 6:
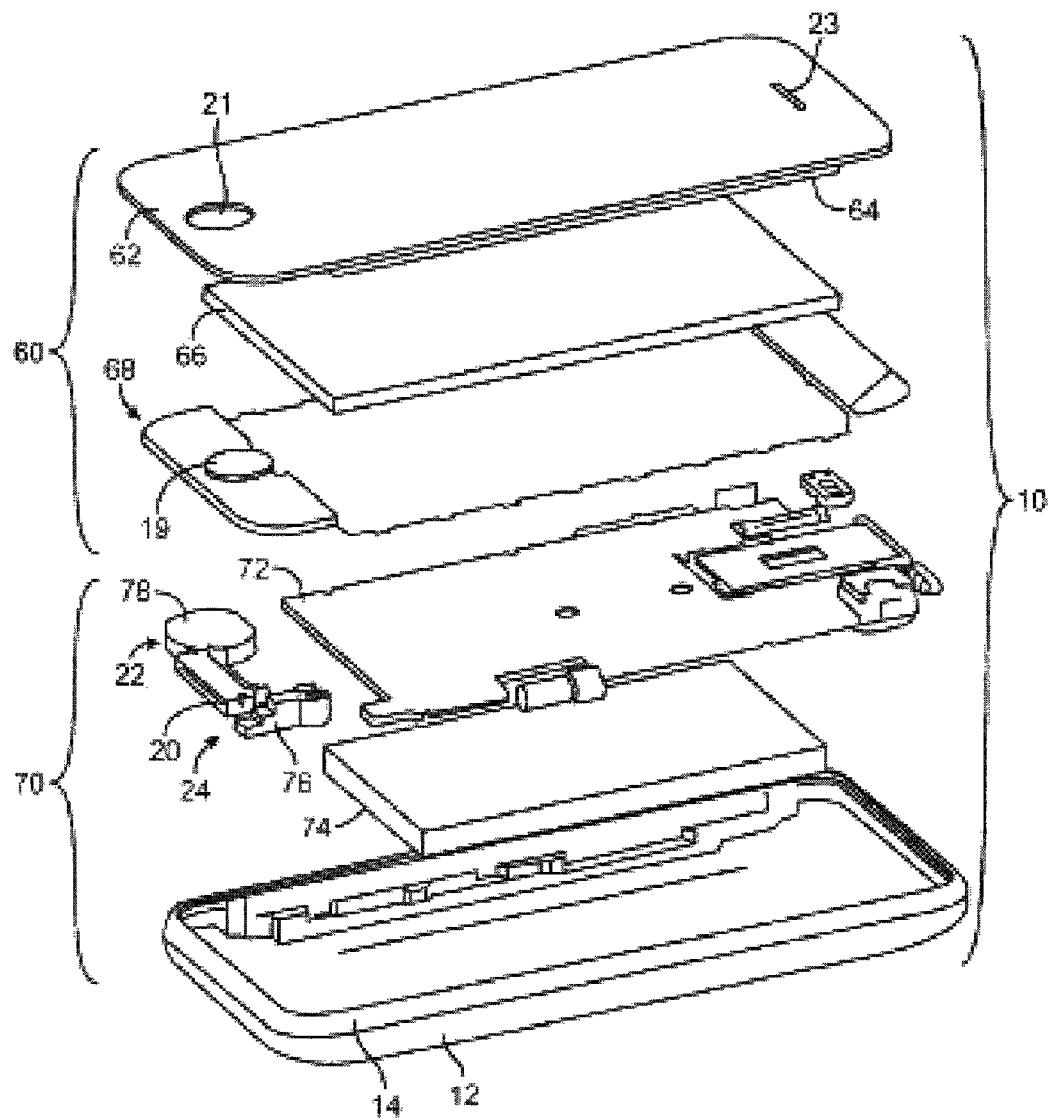
FIG. 6 is an exploded perspective view of an illustrative portable electronic device in accordance with an embodiment of the present invention.

An exploded perspective view showing illustrative components of device 10 is shown in FIG. 6. Tilt assembly 60 (shown in its unassembled state in FIG. 6) may include components such as cover 62, touch sensitive sensor 64, display unit 66, and frame 68. Cover 62 may be formed of glass or other suitable transparent materials (e.g., plastic, combinations of one or more glasses and one or more plastics, etc.) and may have a button hole 21 for accessing a button 19 on frame 68. Display unit 66 may be, for example, a color liquid crystal display. Frame 68 may be formed from one or more pieces. With one suitable arrangement, frame 68 may include metal pieces to which plastic parts are connected using an overmolding process. If desired, frame 68 may be formed entirely from plastic or entirely from metal.

Housing assembly 70 (shown in its unassembled state in FIG. 6) may include a housing such as housing 12. Housing 12 may be formed of plastic and/or other materials such a metal (metal alloys). For example, housing 12 may be formed of plastic to which metal members are mounted using fasteners and/or a plastic overmolding process. Bezel 14 may be formed of plastic or other dielectric materials or may be formed from metal or other conductive materials. Housing assembly 70 may also include one or more printed circuit boards such as printed circuit board 72. Housing assembly 70 may also include components such as microphone 76 for microphone port 24, speaker 78 for speaker port 22, and dock connector 20, integrated circuits, a camera, ear speaker for port 23, audio jack, buttons, SIM card slot, etc.

A user of the device may provide input to the device by input devices such as button 19 or a touch screen. Button 19 is connected to frame 68 and may reciprocate within a button hole such as button hole 21 in cover 62. When depressed by a user, the control circuitry recognizes a deflection of the button component(s), and when the deflection reaches a predetermined limit, which typically corresponds to a predetermined amount of pressure (to avoid switching for inadvertent minor contact with button 19), the circuitry provides a switching function (on/off), to complete a circuit, or to disrupt a circuit. When this condition is detected, an intended function may be performed by the device.

Figure 7:
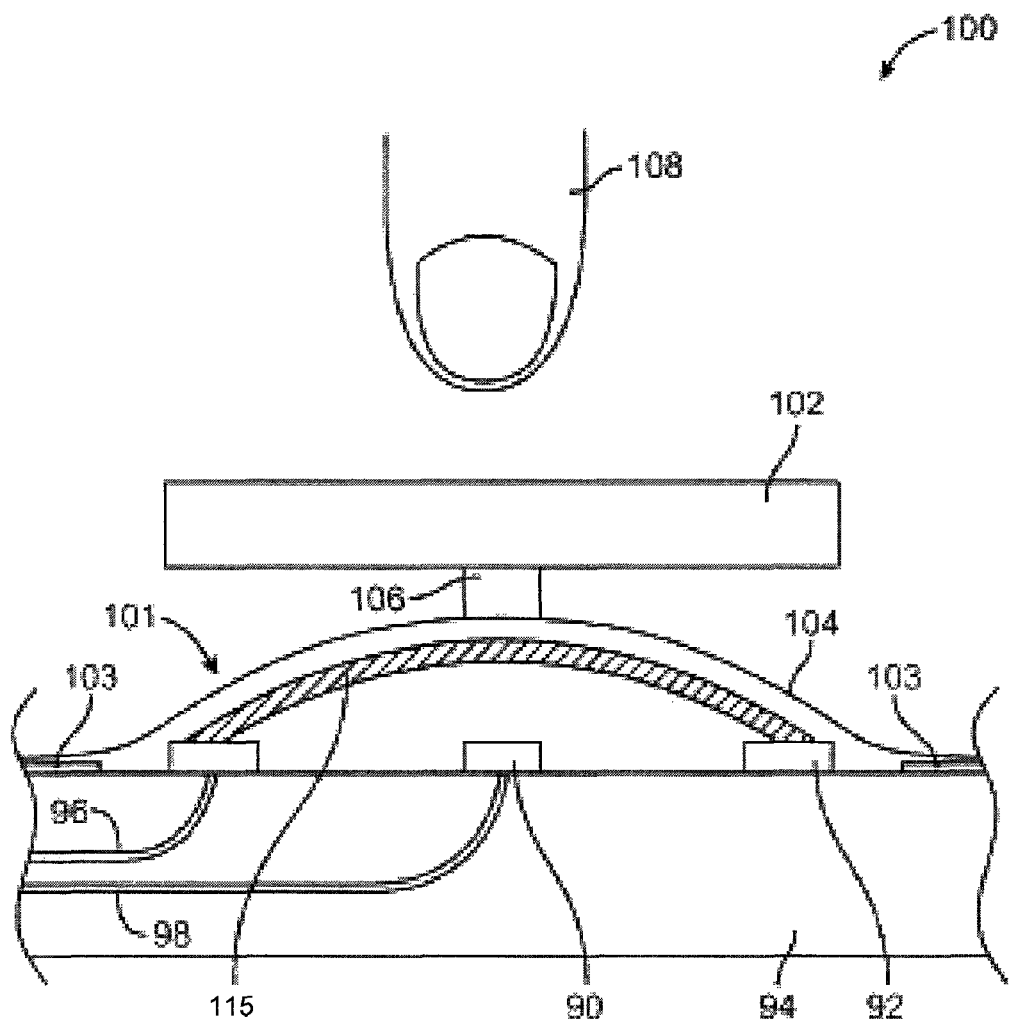
FIG. 7 is a schematic view of a conventional dome switch assembly prior to its being actuated.

Dome switches are sometimes used in handheld devices. A dome switch has a bubble or "dome" with a conductive underside. The dome is typically positioned over a "landing pad" on a printed circuit board substrate. FIG. 7 illustrates the landing pad on a printed circuit board of a conventional dome switch assembly. Printed circuit board 94 provides a landing pad area for the dome switch. Printed circuit board 94 has two traces: a first trace 96 that is connected to a dome switch contact such as fixed outer contact ring 92 and a second trace 98 that is connected to a second dome contact such as fixed center contact 90. Printed circuit board 94 mechanically supports and electrically connects first trace 96 with fixed outer contact ring 92 and second trace 98 with inner contact 90 using conductive traces.

In contrast to traces 96 and 98, which lie beneath or within the substrate of printed circuit board 94, fixed center contact 90 and fixed outer contact ring 92 are formed on the top of printed circuit board 94 and are exposed so that corresponding conductive material within the dome may come into contact with them. In an electrical sense, fixed center contact 90 and fixed outer contact ring 92 form an open circuit such that, when they are electrically connected, they complete the circuit (i.e., the switch is closed). Fixed center contact 90 and fixed outer contact ring 92 are typically made of gold.

The "landing pad" or strike zone of the conductive dome positioned over printed circuit board 94 has a footprint. That is, the conductive zone must cover the footprint in order to actuate the switch. In a system of the type described in FIG. 7, the conductive dome must cover both the inner contact ring 90 and the outer contact ring 92. As such, dome structures, in order to ensure contact and actuation, must cover the area of the circle defined by ring 92. A conventional dome structure is generally larger than ring 92 to provide space for the dome to be properly attached to board 94.

FIG. 7 is illustrative of a conventional dome switch in an unactuated or relaxed position. Conventional dome switch 100 has printed circuit board 94, copper traces 96 and 98, fixed center contact 90 and fixed outer contact ring 92 as discussed in connection with FIG. 4. Dome switch 100 further has a dome 101 made of polyethylene terephthalate ("PET") 104 with underlying adhesive 103 that connects dome 101 to printed circuit board 94. Dome 101 has an underside 115 coated with a conductive material such as graphite or gold. Around the perimeter of dome 101, conductive underside 115 is electrically connected to fixed outer contact ring 92 in the dome relaxed state. Dome switch 100 further has an associated button 102 for actuating switch 100 by finger 108. Button 102 may bear against dome 101 at contact structure 106.

Figure 8:
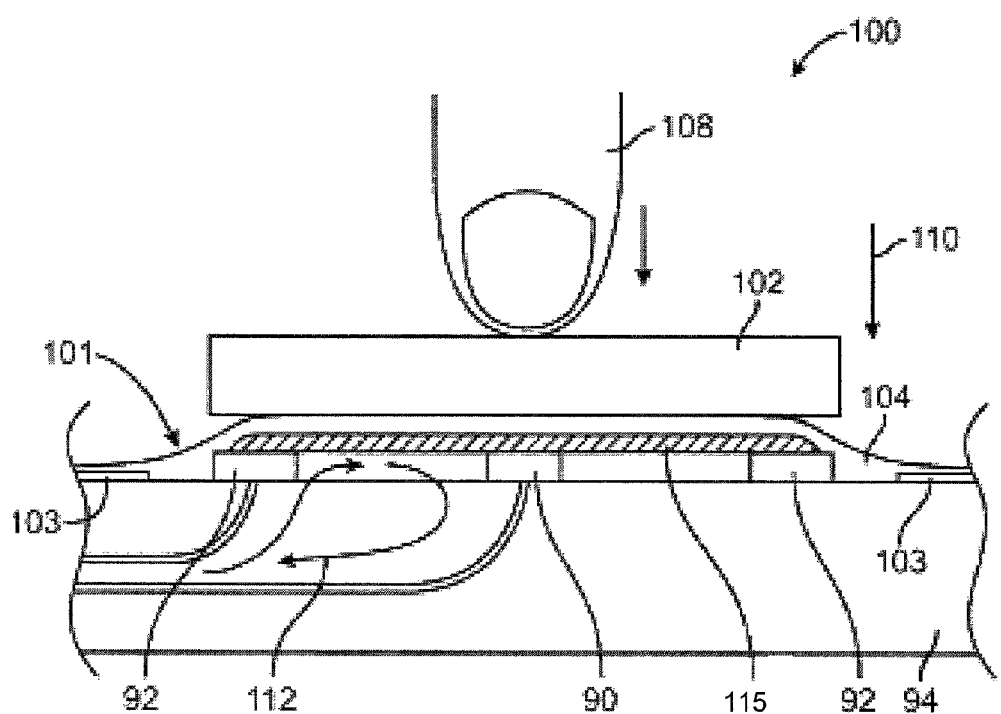
FIG. 8 is a schematic view of a conventional dome switch assembly after it has been actuated.

FIG. 8 is illustrative of dome switch 100 in an actuated or collapsed position. When button 102 is pushed downwardly as shown by arrow 110 by, for example, finger 108, dome 101 is compressed and collapsed. Conductive underside 115 comes into contact with fixed center contact 90 such that fixed center contact 90 and fixed outer contact ring 92 form completed circuit 112 through conductive underside 115, fixed center contact 90, and fixed outer contact ring 92, thereby closing the switch.

Conventional dome switch 100 consumes an area on printed circuit board 94 of at least $\pi r^2$, where r is the radius of ring 92. As such, the area beneath the dome switch, which could be used otherwise to house electrical components such as resistors, capacitors, etc., is consumed by the landing pad for the dome switch. Conventional dome switches also may become permanently deformed upon repeated use due to the physical limitations on the conductive material 115. Use of gold as a conductive material 115 also is expensive.

The preferred embodiments described herein represent an improvement over the known dome switches. The use of a bulk-solidifying amorphous alloy as a deformable material positioned, for example, beneath film 104 provides for a more reliable switch that can be used repeatedly, still provide the tactile feedback of a conventional dome switch, utilize less material, and use up less space on printed circuit board 94.

Figure 9:
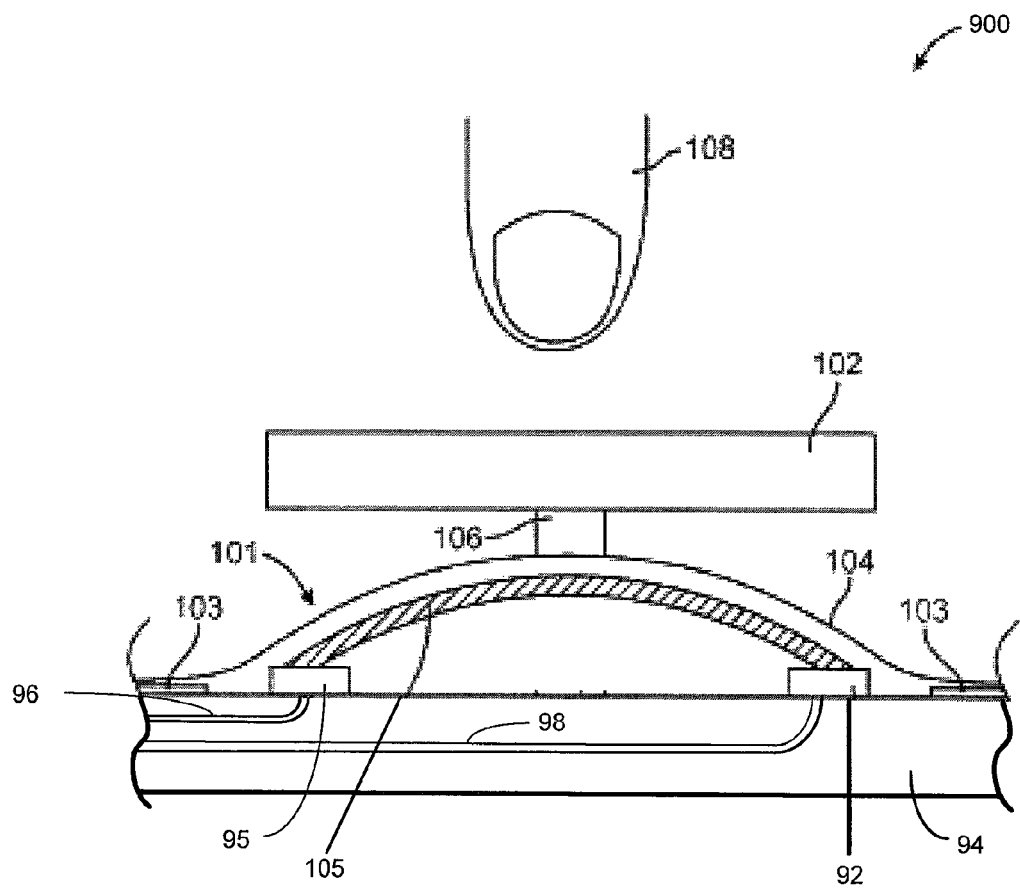
FIG. 9 is a schematic view of a dome switch assembly according to one of the embodiments, prior to its being actuated.

FIG. 9 is illustrative of a dome switch of one embodiment in an unactuated or relaxed position. Dome switch 900 has printed circuit board 94, traces 96 and 98, and contacts 95 and 92. Contacts 95 and 92 may form a ring, or may be point contacts with bulk-solidifying amorphous alloy material 105. Because the contacts need not form a ring, bulk-solidifying amorphous alloy 105 need not be in the shape of a dome, but rather can be in the shape of a rectangular or square film connected at each end to contacts 92 and 95, respectively. Bulk-solidifying amorphous material 15 also may used as the entire dome 101, or may be positioned underneath a protective film 104, which may be formed of any suitable film-forming material. It is preferred to use a protective film 104, however, to connect the dome 101 to printed circuit board 94 via adhesive 103. In this manner, adhesive 103 is not in direct contact with bulk-solidifying amorphous alloy material 105, and consequently, will not interfere with the measurement of the amount of deflection exhibited by material 105 when the switch is actuated. As shown in FIG. 9, dome switch 900 further has an associated button 102 for actuating switch 900 by finger 108. Button 102 may bear against dome 101 at contact structure 106, or button 102 may directly contact dome 101.

Figure 10:
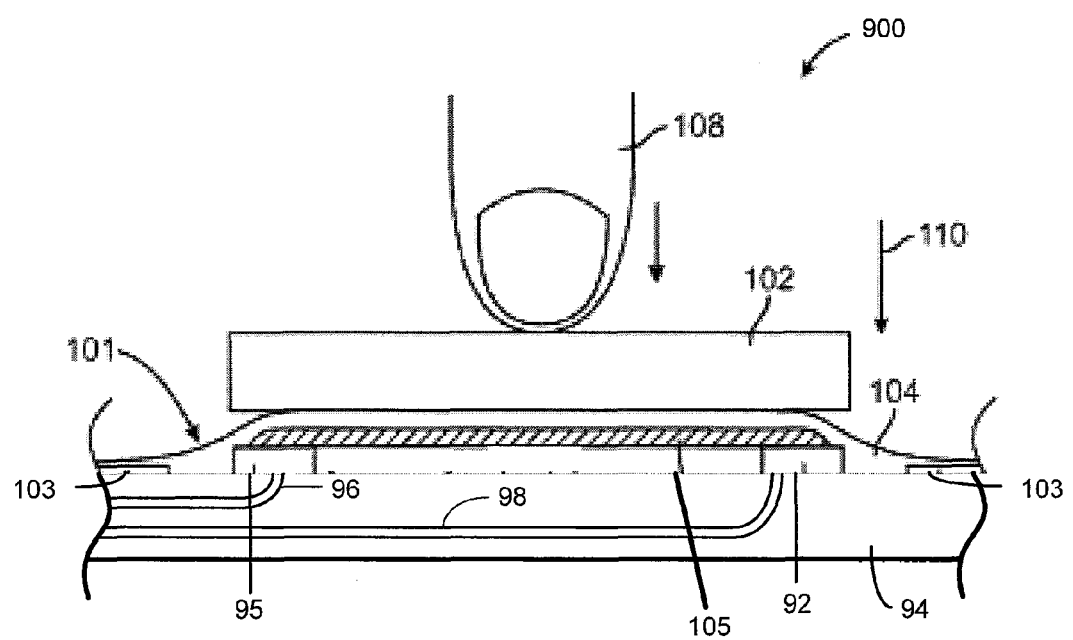
FIG. 10 is a schematic view of a dome switch assembly according to one of the embodiments after it has been actuated.

FIG. 10 is illustrative of dome switch 900 in an actuated or collapsed position. When button 102 is pushed downwardly as shown by arrow 110 by, for example, finger 108, dome 101 is compressed and collapsed, thereby deforming bulk-solidifying amorphous alloy material 105. While the actuated position illustrated in FIG. 10 shows bulk-solidifying amorphous alloy material 105 flattened, it will be understood that bulk-solidifying amorphous alloy material 105 may be deformed only in the center portion or only deformed partially so that it is not flattened. Unlike the conventional dome switch described above, there is no center contact pad 90 that requires the dome to be fully compacted to contact pad and complete the circuit. This negates the need to fully deform the material 105 to its flattened state, thereby saving additional space.

Figure 11:
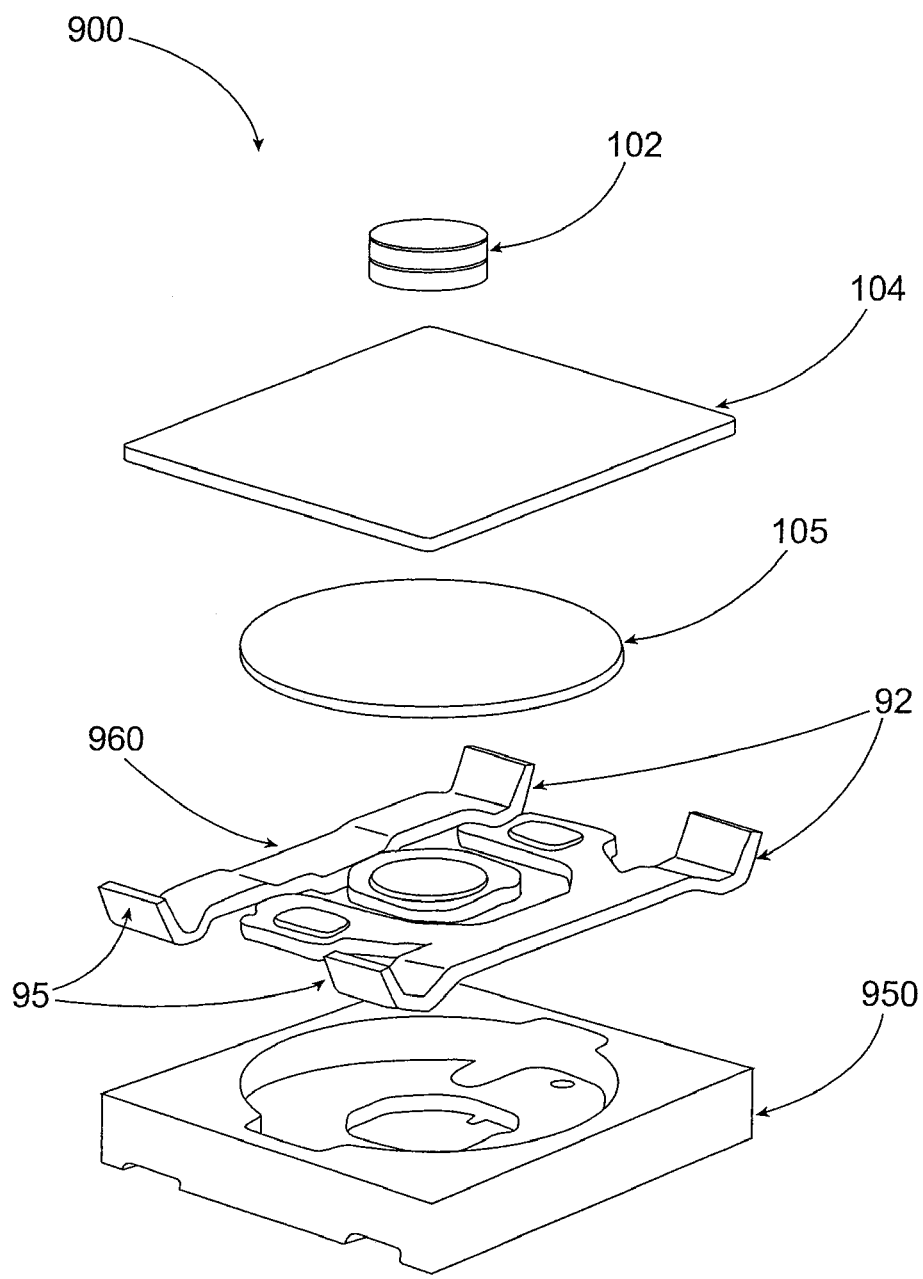
FIG. 11 is an exploded view of a simplified dome switch in accordance with an improved embodiment.

FIG. 11 is an exploded view of a dome switch in accordance with another embodiment of the invention. Dome switch 900 comprises an actuator or button 102 and a film 104, preferably a moisture barrier film that prevents moisture from contacting the deformable bulk-solidifying amorphous alloy 105. Film 104 also preferably is comprised of a suitable plastic material capable of repeated deformation and reconfiguration to its original shape. Switch 900 also includes a bulk-solidifying amorphous alloy 105, also capable of repeated deformation and reconfiguration to its original shape. Bulk-solidifying amorphous alloy 105 is capable of being seated within contact plate 960, which includes contacts 92 and 95 that can be in turn connected to traces 96 and 98, as described above. Contact plate 960 may be comprised of any suitable conductive material, and may include only one contact 92 and one contact 95, or a plurality of each. Finally, contact plate 960 may be seated on, within, or as shown in FIG. 11, below the switch body 950. Switch body 950 preferably includes through holes that make electrical contact between the bulk-solidifying amorphous alloy 105 and contact plate 960, or alternatively, switch body 950 may itself be electrically conductive.

In operation, when a user presses down on button 102 in direction of arrow 110, (FIG. 10), the pressure exerted by the user's finger 108, causes bulk-solidifying amorphous alloy material 105 to deform. The degree of deformation of bulk-solidifying amorphous alloy material 105 will be directly proportional to the amount of pressure applied by the user's finger 108. As described above with reference to FIG. 3, traces 96 and 98 preferably are connected to a control system capable of measuring the amount of deflection, and hence pressure applied by the user's finger 108. Preferably, traces 96 and 98 are connected to bulk-solidifying amorphous alloy material 105 via a constant current circuit.

In operation, a small amount of current is supplied to traces 96 and 98. When in the unactuated position (FIG. 9) the voltage measured by the control system 300 will indicate the resistivity of bulk-solidifying amorphous alloy material 105 in its relaxed state. When actuated (FIG. 10), bulk-solidifying amorphous alloy material 105 will be deformed and the voltage measured by the circuitry that forms a part of control system shown in FIG. 3 will change due to the change in resistivity of the now-deformed bulk-solidifying amorphous alloy material 105. It will be understood that the degree of deformation of bulk-solidifying amorphous alloy material 105 will be proportional to the amount of force applied, and consequently, the change in resistivity measured by control system will be proportional to the amount of force applied.

The control system 300 (FIG. 3) therefore can be designed so that when the degree of deformation of bulk-solidifying amorphous alloy material 105 reaches a predetermined limit, which is related to a predetermined amount of force applied, a switching function is provided. The switching function can either be to turn on a given feature, or turn it off if it is already on. In a particularly preferred embodiment, the amount of force typically applied by a user's finger in actuating a dome switch, is in the range of from about 2.5 to about 5.0 N, which correlates to a deflection of bulk-solidifying amorphous alloy material 105 (or depression or "travel") within the range of from about 0.075 mm to about 0.25 mm. As a particularly preferred embodiment, the control system can be designed to perform the switching function when the change in resistivity measured by the control circuitry that forms a part of control system 300 correlates with a pressure of about 3.4 N, or a travel of bulk-solidifying amorphous alloy material 105 of about 0.15 mm.

Another embodiment is the use of the bulk-solidifying amorphous alloy material as a pressure sensing diaphragm or strain gauge, used in any conventional pressure sensor system including pressure transducers, pressure transmitters, pressure indicators, piezometers, manometers, and the like. Such a pressure sensor operates in a manner similarly to the dome switch embodiment described above, except that instead of a user's finger actuating a button 102, external pressure is exerted on bulk-solidifying amorphous alloy 105 to cause it to deform. The degree of deformation then can be correlated to the pressure by virtue of the change in resistivity measured by the constant current control circuit illustrated in FIG. 3. Instead of performing a switching function, the control circuit would measure the $V_{OUT}$, correlate $V_{OUT}$ to a given pressure depending on the correlation between resistivity and pressure for the particular material employed as bulk-solidifying amorphous material 105, and then provide a read-out of the pressure measured by the sensor. Those skilled in the art will be capable of designing a suitable pressure sensor using the guidelines provided herein.

Use of a bulk-solidifying amorphous alloy described herein instead of the conventional diaphragms and/or strain gauges known in the art, provides for a larger deformation of the respective materials prior to failure. Accordingly, a pressure sensor that utilizes a bulk-solidifying amorphous alloy material as the deformable material by which the pressure is measured has improved sensitivity and can withstand higher pressures than conventional pressure sensors.

Suitable bulk-solidifying amorphous alloys for use as material 105 in the preferred embodiments are described in more detail above.

In one embodiment also relates to a pressure sensor where the deformation of a diaphragm is measured using either a strain gauge, a capacitance or induction. Another embodiment relates to a binary pressure sensor, that senses a single threshold value, wherein the sensing could be done by closing an electrical circuit.

While the invention has been described with reference to particularly preferred embodiments, those skilled in the art will appreciate that various modifications may be made thereto without departing from the spirit and scope thereof.

What is claimed:

1. A pressure sensor comprising:
   a bulk-solidifying amorphous alloy configured to be deformed upon being subjected to pressure; and
   a sensing system electrically connected to the bulk-solidifying amorphous alloy that measures a change in resistivity of the bulk-solidifying amorphous alloy resulting from deformation of the bulk-solidifying amorphous alloy, and provides an output representative of the pressure applied to the bulk-solidifying amorphous alloy.

2. The pressure sensor as claimed in claim 1, wherein the sensing system comprises a constant current control circuit.

3. The pressure sensor as claimed in claim 1, wherein the alloy is described by the following molecular formula: $(Zr, Ti)_a(Ni, Cu, Fe)_b(Be, Al, Si, B)_c$, wherein "a" is in the range of from 30 to 75, "b" is in the range of from 5 to 60, and "c" is in the range of from 0 to 50 in atomic percentages.

4. The pressure sensor as claimed in claim 1, wherein the alloy is described by the following molecular formula: $(Zr, Ti)_a(Ni, Cu)_b(Be)_c$, wherein "a" is in the range of from 40 to 75, "b" is in the range of from 5 to 50, and "c" is in the range of from 5 to 50 in atomic percentages.

5. The pressure sensor as claimed in claim 1, wherein the bulk solidifying amorphous alloy can sustain strains up to 1.5% or more without any permanent deformation or breakage.

6. A switch comprising:
   an actuator;
   a bulk-solidifying amorphous alloy positioned relative to the actuator such that pressing the actuator deforms the bulk-solidifying amorphous alloy;
   a sensing system electrically connected to the bulk-solidifying amorphous alloy that measures a change in resistivity of the bulk-solidifying amorphous alloy resulting from deformation of the bulk-solidifying amorphous alloy, and presents a switching function when the degree of deformation of the bulk-solidifying amorphous alloy reaches a value.

7. The switch as claimed in claim 6, wherein the sensing system comprises a constant current circuit that applies a current to the bulk-solidifying amorphous alloy and measures the change in resistivity of the bulk-solidifying amorphous alloy as the material is deformed.

8. The switch as claimed in claim 7, wherein the change in resistivity is measured as a change in output voltage from the circuit, and the change in output voltage is correlated to the pressure applied to deform the bulk-solidifying amorphous alloy.

9. The switch as claimed in claim 8, wherein the sensing system presents a switching function when the pressure applied to deform the bulk-solidifying amorphous alloy is measured to be within the range of from about 2.5 to about 5.0 N.

10. The switch as claimed in claim 9, wherein the sensing system presents a switching function when the pressure applied to deform the bulk-solidifying amorphous alloy is measured to be about 3.4 N.

11. The switch as claimed in claim 8, wherein the sensing system presents a switching function when the amount of deflection of the bulk-solidifying amorphous alloy is within the range of from about 0.075 mm to about 0.25 mm.

12. The switch as claimed in claim 11, wherein the sensing system presents a switching function when the amount of deflection of the bulk-solidifying amorphous alloy is about 0.15 mm.

13. The switch as claimed in claim 6, wherein a film is positioned between the actuator and the bulk-solidifying amorphous alloy.

14. The switch as claimed in claim 6, wherein the alloy is described by the following molecular formula: $(Zr, Ti)_a(Ni, Cu, Fe)_b(Be, Al, Si, B)_c$, wherein "a" is in the range of from 30 to 75, "b" is in the range of from 5 to 60, and "c" is in the range of from 0 to 50 in atomic percentages.

15. The switch as claimed in claim 6, wherein the alloy is described by the following molecular formula: $(Zr, Ti)_a(Ni, Cu)_b(Be)_c$, wherein "a" is in the range of from 40 to 75, "b" is in the range of from 5 to 50, and "c" is in the range of from 5 to 50 in atomic percentages.

16. The method as claimed in claim 6, wherein the bulk solidifying amorphous alloy can sustain strains up to 1.5% or more without any permanent deformation or breakage.

17. An electronic device comprising a switch, the switch comprising:
    an actuator;
    a bulk-solidifying amorphous alloy positioned relative to the actuator such that pressing the actuator deforms the bulk-solidifying amorphous alloy;
    a sensing system electrically connected to the bulk-solidifying amorphous alloy that measures a change in resistivity of the bulk-solidifying amorphous alloy resulting from deformation of the bulk-solidifying amorphous alloy, and presents a switching function when the degree of deformation of the bulk-solidifying amorphous alloy reaches a value.

18. The electronic device as claimed in claim 17, wherein the sensing system comprises a constant current circuit that applies a current to the bulk-solidifying amorphous alloy and measures the change in resistivity of the bulk-solidifying amorphous alloy as the material is deformed.

19. The electronic device as claimed in claim 17, wherein the device is selected from one or more of the group consisting of a telephone, a cell phone, a land-line phone, a smart phone, an electronic email sending/receiving device a television, an electronic-book reader, a portable web-browser, a computer monitor, a DVD player, a Blue-Ray disk player, a video game console, a music player, a device that provides controlling the streaming of images, videos, and sounds, a remote control, a watch, and a clock.

* * * * *